(12) United States Patent
Iyasu et al.

(10) Patent No.: US 11,183,944 B2
(45) Date of Patent: Nov. 23, 2021

(54) CONTROL APPARATUS FOR POWER CONVERTER

(71) Applicant: DENSO CORPORATION, Kariya (JP)

(72) Inventors: Seiji Iyasu, Nisshin (JP); Yuji Hayashi, Nisshin (JP); Yuichi Handa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/066,973

(22) Filed: Oct. 9, 2020

(65) Prior Publication Data

US 2021/0028717 A1 Jan. 28, 2021

Related U.S. Application Data

(63) Continuation of application No. PCT/JP2019/014106, filed on Mar. 29, 2019.

(30) Foreign Application Priority Data

Apr. 9, 2018 (JP) .............................. JP2018-074962

(51) Int. Cl.
*H02M 7/217* (2006.01)
*H02M 1/42* (2007.01)
(Continued)

(52) U.S. Cl.
CPC .............. *H02M 7/12* (2013.01); *H02M 1/12* (2013.01); *H02M 1/4225* (2013.01);
(Continued)

(58) Field of Classification Search
CPC .......... H02M 1/009; H02M 1/12; H02M 1/42; H02M 1/4208; H02M 1/4225; H02M 3/156; H02M 7/12; H02M 7/21; H02M 7/217; H02M 7/2176; H03K 5/13; H03K 2005/00234
(Continued)

(56) References Cited

U.S. PATENT DOCUMENTS 5,532,918 A * 7/1996 Mayrand ............. H02M 1/4225
363/89
7,580,272 B2 * 8/2009 Taguchi ............... H02M 1/4225
363/89
(Continued)

FOREIGN PATENT DOCUMENTS

JP 2015-198460 A 11/2015

*Primary Examiner* — Gary L Laxton
(74) *Attorney, Agent, or Firm* — Oliff PLC

(57) ABSTRACT

In a control apparatus for a power converter, a current obtainer obtains a current flowing through an inductor as an inductor current, and an alternating-current voltage obtainer obtains an alternating-current voltage. A drive signal outputting unit generates, based on the alternating-current voltage obtained by the voltage obtainer, a sinusoidal command. The drive signal outputting unit performs peak-current mode control to output a drive signal that controls switching of the drive switch to thereby cause the inductor current to follow the sinusoidal command. A delay unit delays, for one switching cycle of the drive switch, an off-switching timing of the drive switch in accordance with the alternating-current voltage. The drive signal defines the off-switching timing of the switch.

6 Claims, 21 Drawing Sheets

(51) Int. Cl.
*H02M 7/12* (2006.01)
*H02M 1/12* (2006.01)
*H02M 7/48* (2007.01)
*H03K 5/13* (2014.01)
*H03K 5/00* (2006.01)
*H02M 1/00* (2006.01)

(52) U.S. Cl.
CPC ........... *H02M 7/2176* (2013.01); *H02M 7/48* (2013.01); *H03K 5/13* (2013.01); *H02M 1/0009* (2021.05); *H03K 2005/00234* (2013.01)

(58) Field of Classification Search
USPC .............................................. 363/89; 323/222
See application file for complete search history.

(56) References Cited

U.S. PATENT DOCUMENTS

| | | | |
|---|---|---|---|
| 8,111,050 B2* | 2/2012 | Sutardja | H02M 7/217 323/207 |
| 8,379,420 B2* | 2/2013 | Orr | H02M 1/4225 363/80 |
| 9,455,623 B2* | 9/2016 | Fan | H02M 1/4225 |
| 2004/0047166 A1* | 3/2004 | Lopez-Santillana | H02M 7/53873 363/89 |
| 2014/0204639 A1* | 7/2014 | Wu | H02M 1/4225 363/89 |
| 2014/0225553 A1* | 8/2014 | Otorii | H02M 1/4225 318/722 |
| 2018/0054113 A1* | 2/2018 | Kim | H02M 7/06 |
| 2019/0052179 A1* | 2/2019 | Bhandarkar | H02M 1/4225 |

\* cited by examiner

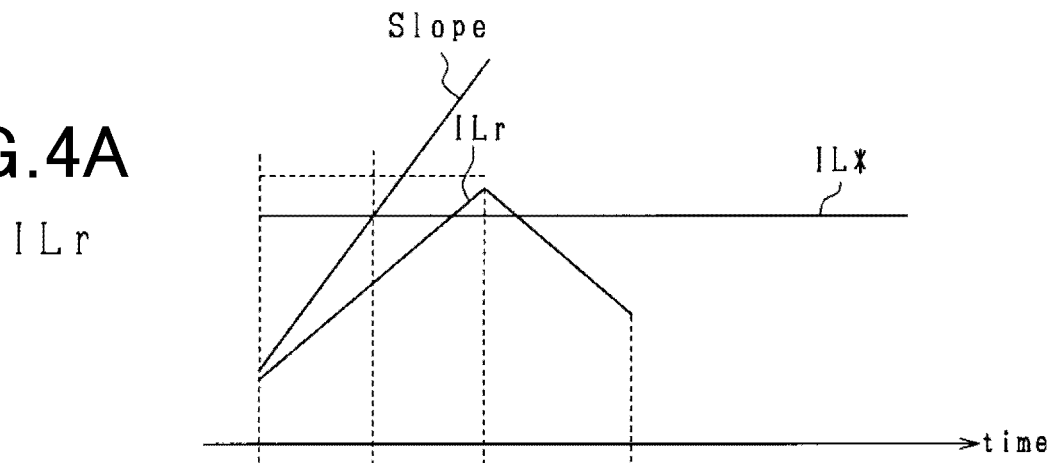
FIG.4A
FIG.4B
FIG.4C
FIG.5
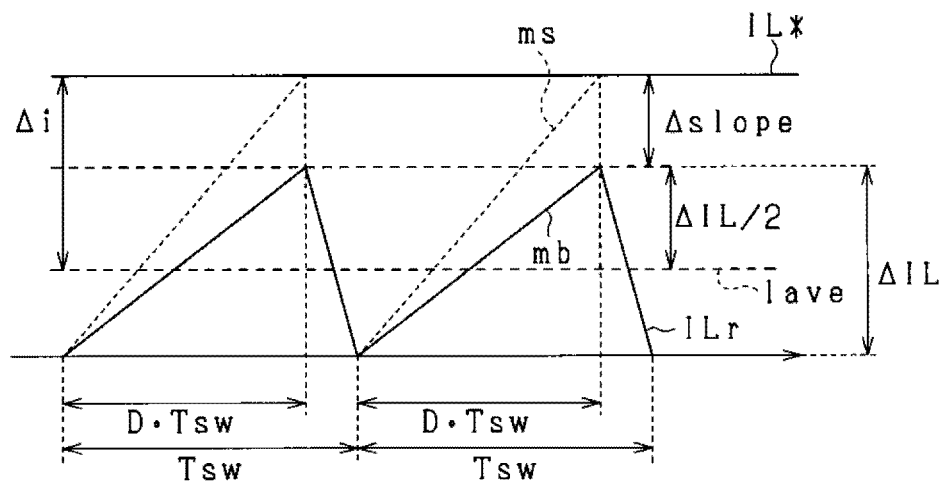

FIG.8A1
FIRST EMBODIMENT
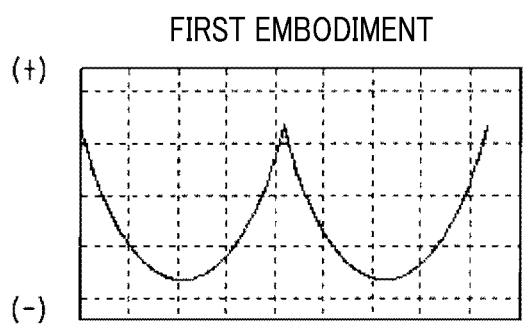
FIG.8A2
FIRST COMPARATIVE EXAMPLE
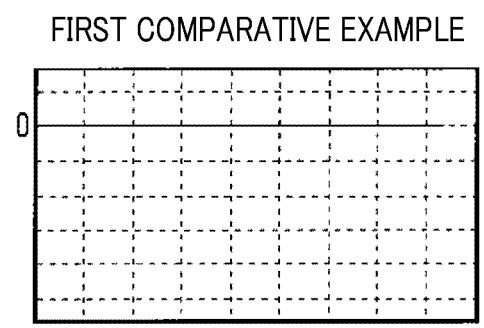
FIG.8B1
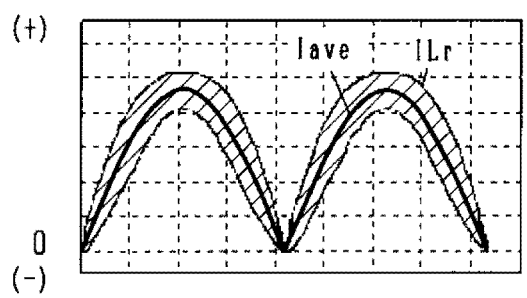
FIG.8B2
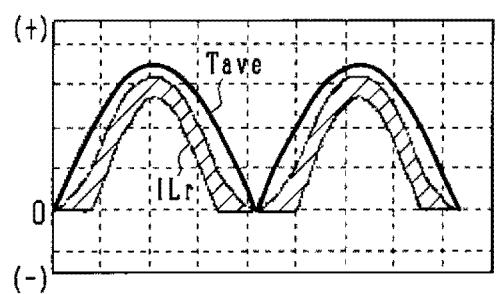
FIG.8C1
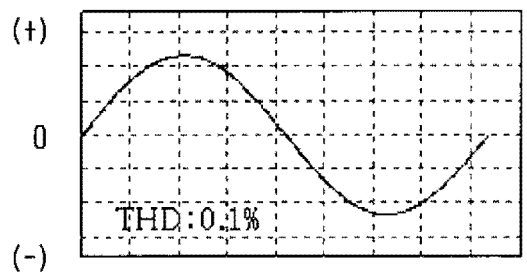
FIG.8C2
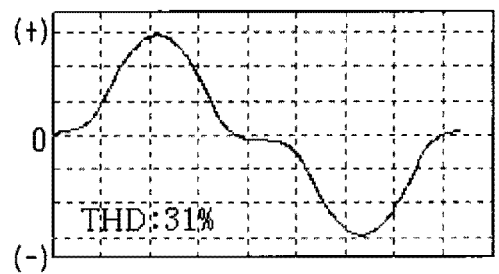

ILr

Iac

FIG.18A1
THIRD EMBODIMENT
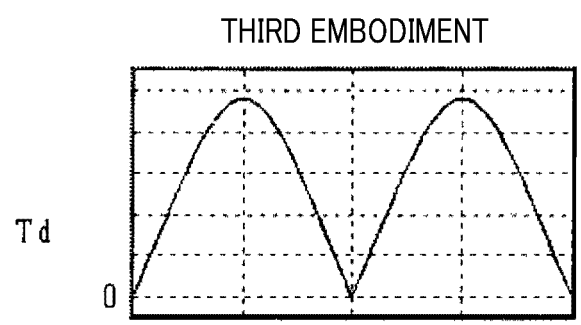
FIG.18A2
SECOND COMPARATIVE EXAMPLE
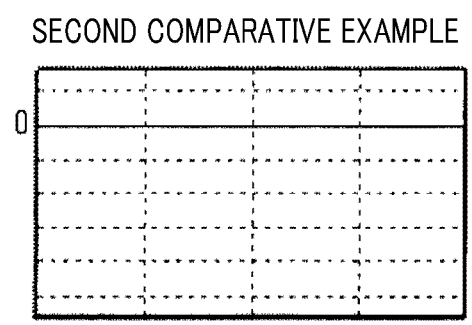
FIG.18B1
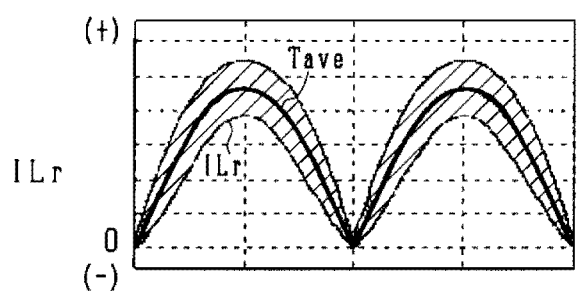
FIG.18B2
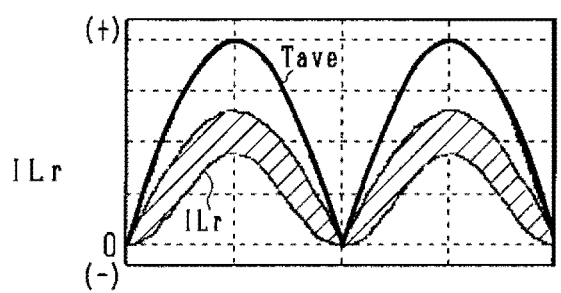
FIG.18C1
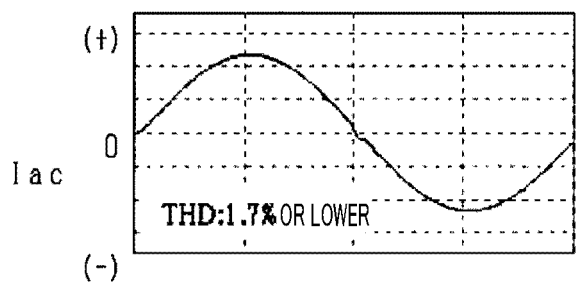
FIG.18C2
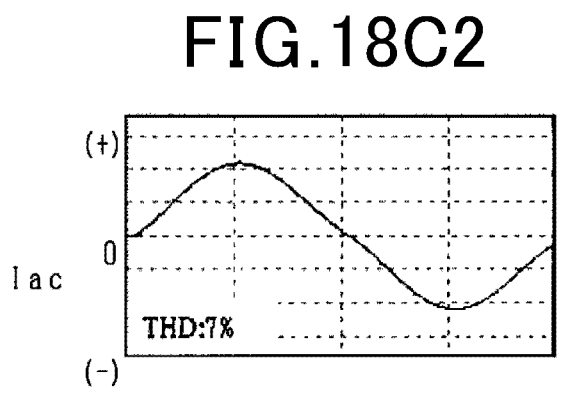

FIG.21G

CONTROL APPARATUS FOR POWER CONVERTER

CROSS REFERENCE TO RELATED APPLICATION

This application is a bypass continuation application of currently pending international application No. PCT/JP2019/014106 filed on Mar. 29, 2019 designating the United States of America, the entire disclosure of which is incorporated herein by reference.

This application is based on and claims the benefit of priority from Japanese Patent Application No. 2018-074962 filed on Apr. 9, 2018, the entire disclosure of which is incorporated herein by reference.

TECHNICAL FIELD

The present disclosure relates to control apparatuses for a power converter.

BACKGROUND

There is known a control apparatus that performs peak-current mode control that controls on-off switching operations of each of switches to thereby adjust an inductor current, which flows through an inductor of a power converter, to a current command.

SUMMARY

A control apparatus according to an exemplary aspect of the present disclosure is applicable to a power converter that includes an inductor and a drive switch, and that converts one of an alternating-current voltage and a direct-current voltage input thereto into the other of the alternating-current voltage and the direct-current voltage. The control apparatus is configured to perform peak-current mode control to output a drive signal that controls switching of the drive switch to thereby cause an inductor current to follow a sinusoidal command. The control apparatus is configured to delay, for one switching cycle of the drive switch, an off-switching timing of the drive switch in accordance with the alternating-current voltage, the drive signal defining the off-switching timing of the switch.

BRIEF DESCRIPTION OF THE DRAWINGS

Other aspects of the present disclosure will become apparent from the following description of embodiments with reference to the accompanying drawings in which:

FIGS. 4A to 4C are a joint timing chart schematically illustrating a relationship between an off-switching timing and an inductor current;

FIG. 5 is a graph schematically illustrating a deviation range parameter;

FIGS. 8A1 to 8C2 respectively illustrate graphs used to describe benefits achieved by the first embodiment;

FIGS. 11A to 11H are a joint timing chart of the power conversion system;

FIGS. 18A1 to 18C2 respectively illustrate graphs used to describe benefits achieved by the third embodiment;

FIGS. 21A to 21G are a joint timing chart of the power conversion system; and

DETAILED DESCRIPTION OF EMBODIMENT

Inventor's Viewpoint

Figure 1:
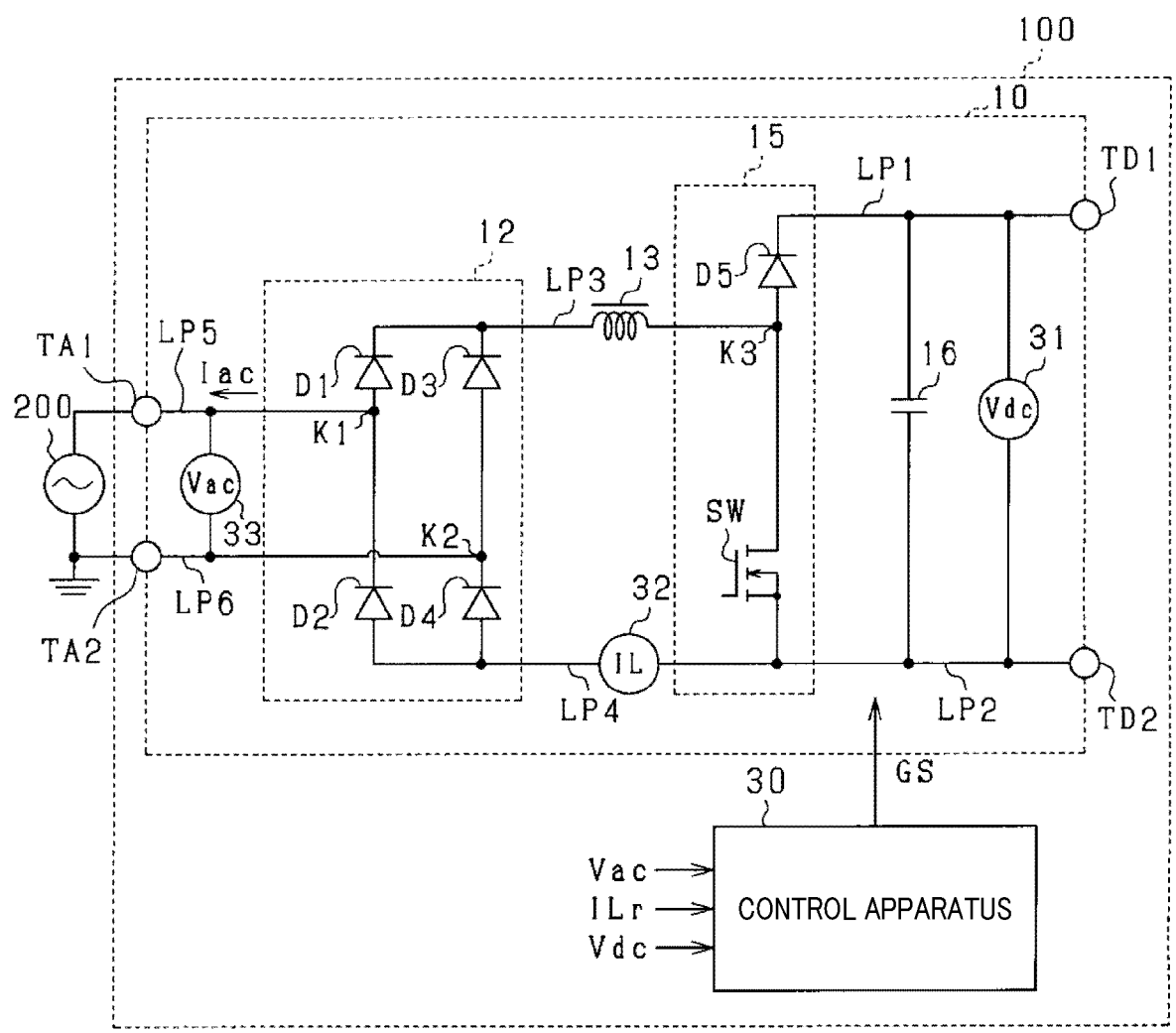
FIG. 1 is a circuit configuration diagram of a power conversion system according to the first embodiment.

Japanese Patent Application Publication No. 2015-198460 discloses a control apparatus that performs peak-current mode control that controls on-off switching operations of each of switches to thereby adjust an inductor current, i.e. a reactor current, which flows through an inductor, i.e. a reactor, of a power converter, to a current command. The control apparatus also adds, to the current command, a current correction that depends on the phase of an input alternating-current (AC) voltage, thus reducing distortion in the waveform of the alternating current.

Specifically, the control apparatus successively calculates an average of the inductor current, and calculates a deviation of each of the successively calculated averages from a corresponding value of the current command. Then, the control apparatus uses the calculated deviation as the current correction for each of the successively calculated averages.

This may cause the processing load of the control apparatus to be higher.

From this viewpoint, one aspect of the present disclosure seeks to provide control apparatuses for a power converter, each of which is configured to have a lower processing load for reducing a degree of distortion in the waveform of an alternating current input to or output from the power converter.

According to an exemplary aspect of the present disclosure, there is provided a control apparatus applicable to a power converter that includes an inductor and a drive switch, and that converts one of an alternating-current voltage and a direct-current voltage input thereto into the other of the alternating-current voltage and the direct-current voltage. The control apparatus includes a current obtainer configured to obtain a current flowing through the inductor as an inductor current, an alternating-current voltage obtainer configured to obtain the alternating-current voltage, and a drive signal outputting unit.

The drive signal generating unit is configured to generate, based on the alternating-current voltage obtained by the voltage obtainer, a sinusoidal command, and perform peak-current mode control to output a drive signal that controls switching of the drive switch to thereby cause the inductor current to follow the sinusoidal command. The control apparatus includes a delay unit configured to delay, for one switching cycle of the drive switch, an off-switching timing of the drive switch in accordance with the alternating-current voltage; the drive signal defines the off-switching timing of the switch.

Power converters, each of which performs peak-current mode control to control switching of a drive switch, may cause an inductor current flowing through an inductor to be deviated from its predetermined designed current, resulting in distortion in an alternating current. Adjusting the inductor current to an appropriate value therefore enables the degree of distortion in the alternating current to be reduced.

Because a command for the inductor current is generated as a sinusoidal command based on the alternating-current voltage, it is possible to use the alternating-current voltage as a parameter indicative of the phase of the inductor current.

In addition, changing the duty factor, which represents a controllable ratio of the on-duration of the drive switch to one switching cycle, makes it possible to adjust the inductor current flowing through the inductor.

The inventors have focused on these relationships and thereby have found that delaying an off-switching timing of the drive switch based on the alternating-current voltage enables distortion in the alternating current to be suppressed.

From this viewpoint, the control apparatus according to the exemplary aspect performs the peak-current mode control to output the drive signal that controls switching of the drive switch to thereby cause the inductor current to follow the sinusoidal command. Then, the control apparatus delays, for one switching cycle of the drive switch, the off-switching timing of the drive switch in accordance with the alternating-current voltage; the drive signal defines the off-switching timing of the switch.

This delaying of the off-switching timing of the drive switch suppresses distortion in the alternating current. The control apparatus according to the exemplary aspect therefore enables the processing load of the control apparatus to be lower as compared with a processing load of a conventional control apparatus that calculates a deviation range parameter, and uses the calculated deviation range parameter as the current correction for the inductor current.

EMBODIMENT

First Embodiment

The following describes the first embodiment of the present disclosure with reference to the drawings. A power converter system 100 according to the first embodiment is configured to convert an alternating-current (AC) voltage supplied from an AC power source into a direct-current (DC) voltage.

Referring to FIG. 1, the power converter system 100 includes an AC-DC converter 10.

The AC-DC converter 10 includes first and second AC terminals TA1 and TA2, and first and second DC terminals TD1 and TD2. The AC-DC converter 10 is connected to an AC power source 200 via the first and second AC terminals TA1 and TA2. The AC-DC converter 10 is also connected to at least one unillustrated device via the first and second DC terminals TD1 and TD2. A commercial power source can be used as the AC power source 200. The at least one device includes, for example, a DC power source, such as a battery, and/or a DC-DC converter.

The AC-DC converter 10 includes a full-bridge circuit 12, a half-bridge circuit 15, an inductor, i.e. a reactor, 13, a capacitor 16, and first to sixth wirings LP1 to LP6. Each of the first to sixth wirings LP1 to LP6 has opposing first and second ends.

The full-bridge circuit 12 includes first to fourth diodes D1 to D4. The anode of the first diode D1 is connected to the cathode of the second diode D2, and the anode of the third diode D3 is connected to the cathode of the fourth diode D4. The cathode of each of the first and third diodes D1 and D3 is connected to the first end of the third wiring LP3, and the anode of each of the second and fourth diodes D2 and D4 is connected to the first end of the fourth wiring LP4.

The connection point, which will be referred to as a first connection point K1, between the anode of the first diode D1 and the cathode of the second diode D2 is connected to the first end of the fifth wiring LP5, and the second end of the fifth wiring LP5 is also connected to the first AC terminal TA1.

The connection point, which will be referred to as a second connection point K2, between the anode of the third diode D3 and the cathode of the fourth diode D4 is connected to the first end of the sixth wiring LP6, and the second end of the sixth wiring LP6 is also connected to the second AC terminal TA2.

The half-bridge circuit 15 includes a fifth diode D5 and a switch SW. The first embodiment uses an N-channel MOSFET as the switch SW, which is an example of a voltage-controlled switch. The anode of the fifth diode D5 is connected to the drain of the switch SW. The cathode of the fifth diode D5 is connected to the first end of the first wiring LP1, and the second end of the first wiring LP1 is connected to the first DC terminal TD1. The source of the switch SW is connected to the first end of the second wiring LP2, and the second end of the second wiring LP2 is connected to the second DC terminal T2. The switch SW includes an intrinsic diode connected in antiparallel thereto.

The connection point, which will be referred to as a third connection point K3, between the anode of the fifth diode D5 and the drain of the switch SW, is connected to the second end of the third wiring LP3. The inductor 13 is mounted on the third wiring LP3. The source of the switch SW is connected to the second end of the fourth wiring LP4.

The capacitor 16 is connected between the first and second wirings LP1 and LP2.

The power converter system 100 also includes a first voltage sensor 31, a current sensor 32, and a second voltage sensor 33. The first voltage sensor 31 is connected between the first wiring LP1 and the second wiring LP2, and configured to measure a voltage across the capacitor 16 as a DC voltage Vdc. The current sensor 32 is provided on the fourth wiring LP4, and configured to measure a current flowing through the inductor 13 as an inductor current ILr. The second voltage sensor 33 is connected between the fifth wiring LP5 and the sixth wiring LP6, and configured to measure a voltage across the AC power source 200 as an AC voltage Vac.

The power converter system 100 additionally includes a control apparatus 30. The control apparatus 30 provides various functions, each function provided by the control apparatus 30 can be implemented by, for example, one or more computers that execute software stored in a non-transitory storage medium, one or more hardware devices, and the combinations of the one or more computers and the one or more hardware devices.

Figure 2:
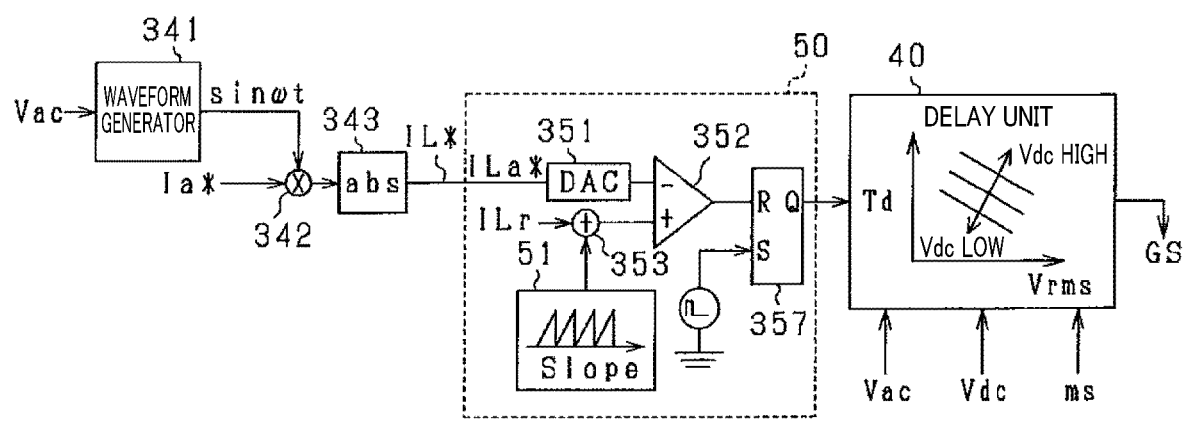
FIG. 2 is a functional block diagram for describing functions of a control apparatus.

FIG. 2 is a functional block diagram illustrating the functions of the control apparatus 30.

The control apparatus 30 is configured to perform known peak current mode control that controls on-off operations of the switch SW. For example, the control apparatus 30 functionally includes a waveform generator 341, a multiplier 342, an absolute value calculator 343, and a current control unit 50.

The waveform generator 341 generates a reference waveform sin ωt that represents how the AC voltage Vac is changed for each half period (T/2); ω represents the angular velocity of the AC voltage Vac.

For example, the waveform generator 341 detects each time of zero-crossing of the AC voltage Vac measured by the second voltage sensor 33 as a zero-crossing point. That is, the waveform generator 341 sequentially detects adjacent zero-crossing points of the AC voltage Vac, and sets an interval between the adjacent zero-crossing points as the half period (T/2) of the AC voltage Vac. Then, the waveform generator 341 calculates the angular velocity ω of the AC voltage Vac in accordance with the following equation "ω=2π×(1/T)", and sets an angular velocity of a sinusoidal waveform having an amplitude of 1 to the calculated angular velocity ω, thus generating the reference waveform sin ωt with the same phase as the phase of the AC voltage Vac.

The multiplier 342 multiplies an amplitude command Ia* for the inductor current ILr and the reference waveform sin ωt by each other, thus outputting a multiplication result expressed by "Ia*×sin ωt". The amplitude command Ia* is a command determining the amplitude of the inductor current ILr, and can be defined based on, for example, a voltage command Vdc* for the output DC voltage Vdc.

The absolute value calculator 343 calculates an absolute value of the multiplication result "Ia*×sin ωt" to thereby calculate a value |Ia*×sin ωt| as a command current IL*. The command current IL*, which is expressed by |Ia*×sin ωt|, corresponds to, for example, a command for the inductor current ILr in the first embodiment.

The current control unit 50 performs the peak-current mode control that determines a gate signal GS for the switch SW for on-off control of the switch SW in accordance with the inductor current ILr measured by the current sensor 32, and the corrected command current ILa*, and outputs the gate signal GS to the switch SW, thus controlling on-off switching operations of the switch SW. For example, the current control unit 50 performs the peak-current mode control that determines, based on the inductor current ILr and the corrected command current ILa*, the gate signal GS. The current control unit 50 serves as a drive signal outputting unit according to the first embodiment.

The current control unit 50 includes a digital-to-analog (D/A) converter 351, a comparator 352, an adder 353, an RS flipflop 357, and a slope compensator 51.

The comparator 352 has a non-inverting input terminal, an inverting input terminal, and an output terminal.

The D/A converter 351 converts the command current IL*, which has a digital signal format, into the command current IL*, which has an analog signal format, and inputs the command current IL*, which has the analog signal format, to the non-inverting input terminal of the comparator 352.

The slope compensator 51 generates a slope compensation signal Slope, and outputs the slope compensation signal Slope to the adder 353. The slope compensation signal Slope works to reduce oscillation of the inductor current ILr due to fluctuations of the inductor current ILr.

The adder 353 adds the slope compensation signal Slope to the inductor current ILr, that is, calculates the sum of the slope compensation signal Slope and the inductor current ILr. Then, the adder 353 inputs the sum (Slope+ILr) of the slope compensation signal Slope and the inductor current ILr to the non-inverting input terminal of the comparator 352. The sum (Slope+ILr) of the slope compensation signal Slope and the inductor current ILr will be referred to as a slope-corrected inductor current (Slope+ILr).

The flipflop 357 has a reset terminal (R), a set terminal (S), and an output terminal (Q).

The comparator 352 compares the corrected command current ILa* input to the inverting input terminal with the slope-corrected inductor current (Slope+ILr) input to the non-inverting input terminal to thereby 1. Output a low-level signal to the reset terminal R of the flipflop 357 while the slope-corrected inductor current (Slope+ILr) is lower than the command current IL*

2. Output a high-level signal to the reset terminal R of the flipflop 357 while the slope-corrected inductor current (Slope+ILr) is higher than the corrected command current IL*

Additionally, a predetermined clock is input to the set terminal S of the flipflop 357.

An interval between adjacent rising timings of the clock from a low level to a high level serves as a switching cycle Tsw of the switch SW.

The output terminal Q of the flipflop 357 is connected to the gate of the switch SW via a delay unit 40. A signal outputted from the Q terminal of the flipflop 357 to the gate of the switch SW serves as the gate signal GS.

Next, the following describes how the power converter system 100 operates.

The current control unit 50 performs the peak-current mode control that controls the switch SW to output the gate signal GS with the high level to the gate of the switch SW, thus closing, i.e. turning on, the switch SW. This provides a closed loop including the inductor 13 and the switch SW.

In the closed loop, a current flows through the inductor 13, enabling magnetic energy to be charged in the inductor 13.

The current control unit 50 performs the peak-current mode control that controls the switch SW to output the gate signal GS with the low level to the gate of the switch SW, thus opening, i.e. turning off, the switch SW. The magnetic energy charged in the inductor 13 causes a current to flow through the fifth diode D5 to the first DC terminal TD1.

Figure 3A:
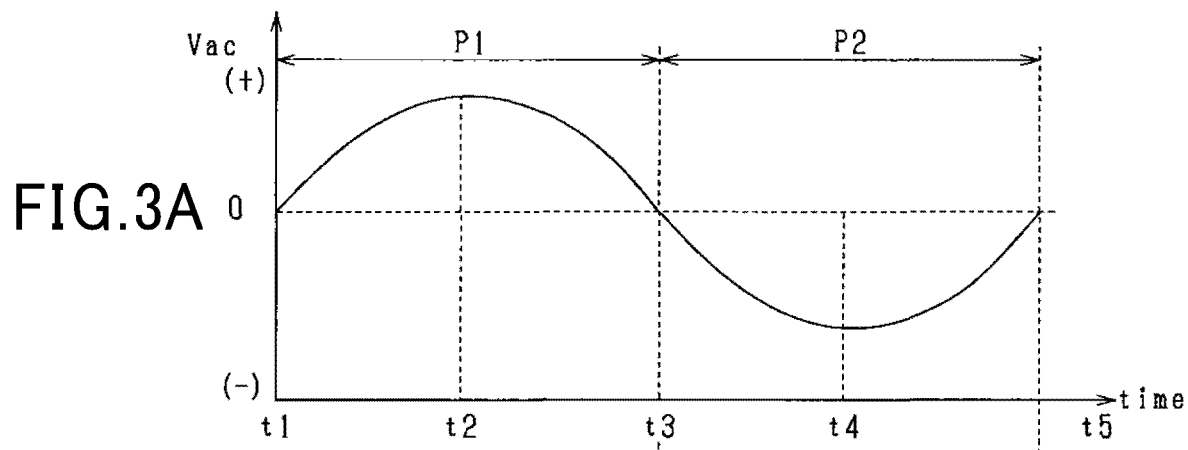
FIGS. 3A to 3D are a joint timing chart schematically illustrating a delay quantity set based on an alternating-current voltage.
Figure 3B:
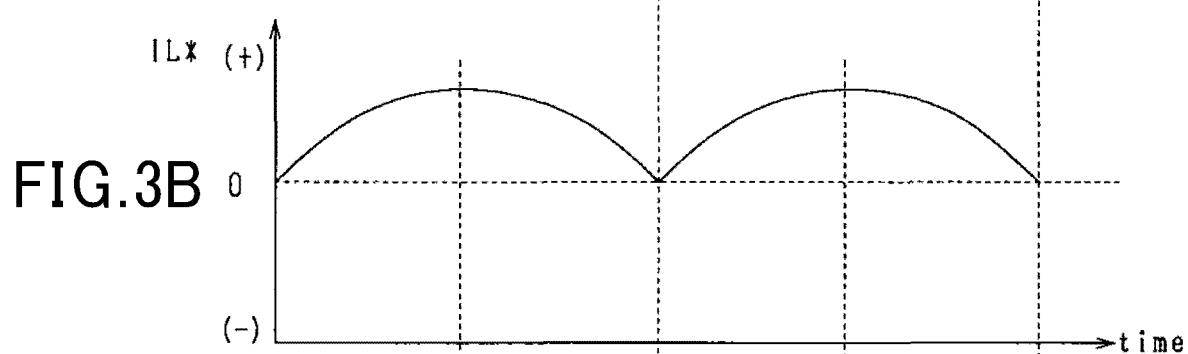
Figure 3C:
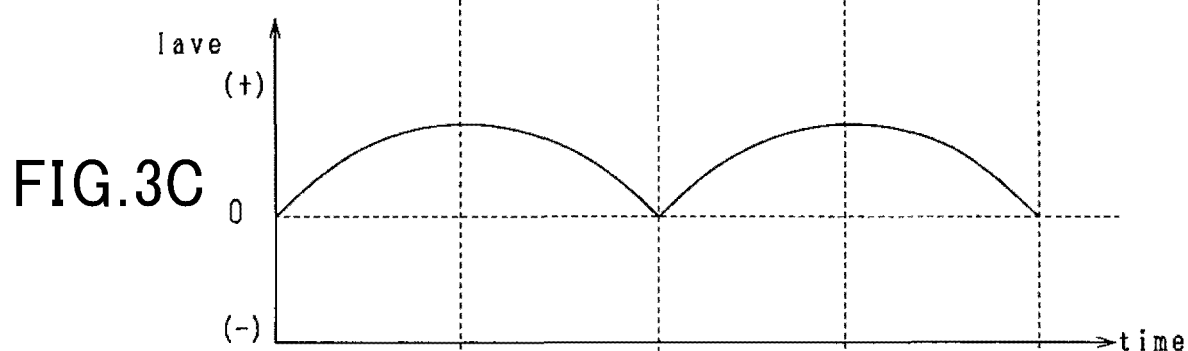
Figure 3D:
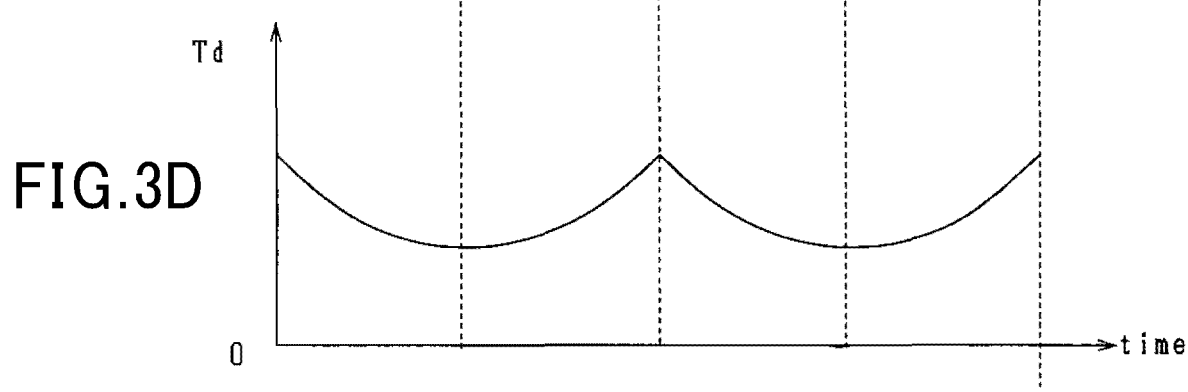

FIG. 3A illustrates how the AC voltage Vac is changed over time, and FIG. 3B illustrates how the command current IL* is changed over time. FIG. 3C illustrates how an average Iave of the inductor current ILr is changed over time, and FIG. 3D illustrates how a delay quantity Td is changed over time. Note that, in each of FIGS. 3A to 3D, the power factor is set to 1.

FIG. 4A illustrates how the inductor current ILr is changed for one switching cycle Tsw, FIG. 4B illustrates how an output OUTc of the comparator 352 is changed for one switching cycle Tsw, and FIG. 4C illustrates how the gate signal GS is changed for one switching cycle Tsw.

As illustrated in FIG. 3B, the command current IL* is changed such that a positive half of a sinusoidal wave appears for each half period of the AC voltage Vac. FIG. 3C shows that the average Iave of the inductor current ILr with no distortion therein is changed such that a positive half of a sinusoidal wave appears for each half period of the AC voltage Vac, which is similar to the command current IL*.

Distortion, i.e. harmonic distortion, may be actually contained in the inductor current ILr. This may cause the waveform of the average Iave of the inductor current ILr to be changed from the normal waveform of the Iave illustrated in FIG. 3C. A distorted inductor current ILr may cause an alternating current Iac flowing into the AC-DC converter 10 through the first AC terminal TA1 to have distortion. From this viewpoint, the control apparatus 30 is configured to adjust the inductor current ILr to thereby reduce a degree of distortion in the alternating current Iac.

Because the command current IL*, which represents a command for the inductor current ILr, is changed in synchronization with the AC voltage Vac, the control apparatus 30 can use the AC voltage Vac as a parameter indicative of the phase of the inductor current ILr.

Additionally, changing a turn-off switching timing of the switch SW in a present switching cycle Tsw enables a duty factor, which represents a controllable ratio, i.e. percentage, of the on-duration Ton of the switch SW to the present switching cycle Tsw, to be changed, resulting in the inductor current ILr being changed.

Specifically, as illustrated in FIGS. 4A to 4C, when the slope-corrected inductor current (Slope+ILr) increases up to the command current IL* based on the peak-current mode control, the output OUTc of the comparator 352 is turned to the high level, causing the gate signal GS to fall down. That is, the period from the switching of the clock signal input to the S terminal of the RS flipflop 357 to the high level to the switching of the output OUTc of the comparator 352 to the high level during each switching cycle Tsw shows the on-duration Ton of the switch SW through which the inductor current ILr flows.

For this reason, delaying the turn-off timing of the switch SW enables the duty factor of the switch SW to increase, resulting in the inductor current ILr to increase. FIG. 4C illustrates that delaying the fall time of the gate signal GS to the low level by a delay quantity Td from time ta to time tb enables the inductor current ILr to increase.

From this viewpoint, the control apparatus 30 includes the delay unit 40 configured to delay the turn-off switching timing of the switch SW in accordance with the AC voltage Vac.

Specifically, if the AC voltage Vac is converted into the DC voltage Vdc with the inductor current ILr containing distortion, a deviation range parameter indicative of how the command current IL* is deviated from the average Iave of the inductor current ILr takes a largest absolute value each time the AC voltage Vac reaches a corresponding one of zero-crossing points or becomes close to a corresponding one of zero-crossing points (see times t1, t3, and t5).

In contrast, if the AC voltage Vac is converted into the DC voltage Vdc with the inductor current ILr containing distortion, the deviation range parameter takes a smallest value each time the AC voltage Vac reaches a corresponding one of peaks or becomes close to a corresponding one of peaks (see times t2 and t4).

Based on the above features, the control apparatus 30 is configured to control the delay quantity Td for delaying the fall time of the switch SW such that the delay quantity Td cyclically changes to (1) Take a local maximum value each time the AC voltage Vac reaches a corresponding one of the zero-crossing points (see times t1, t3, and t5 in FIG. 3D)

(2) Take a local minimum value each time the AC voltage Vac reaches a corresponding one of the peaks (see times t2 and t4 in FIG. 3D)

This configuration enables the inductor current ILr to have a larger value each time the AC voltage Vac reaches a corresponding one of the zero-crossing points, resulting in a reduction of a degree of distortion in the alternating current Iac.

The delay unit 40 according to the first embodiment sets the delay quantity Td of the gate signal to GS outputted from the current controller 50 in accordance with the AC voltage Vac, the DC voltage Vdc, and a slope ms that represents the gradient or slope of the slope compensation signal Slope. Specifically, the delay unit 40 sets the delay quantity Td for each period of the AC voltage Vac such that the delay quantity Td has 1. A negative peak for each of a first period P1 and a second period P2 of the AC voltage Vac; the first period P1 represents a positive half period of the AC voltage Vac, and the second period P2 represents a negative half period of the AC voltage Vac 2. A positive peak between the first and second periods P1 and P2 of the AC voltage Vac It is necessary to set the duty factor of the switch SW to be lower than a predetermined threshold duty for preventing subharmonic oscillations of the inductor current ILr. When a decreasing slope ma of the inductor current ILr, that is, a decreasing speed of the inductor current ILr, becomes steeper, the amount of decrease in the inductor current ILr becomes greater. For this reason, a steeper decreasing slope ma of the inductor current ILr for a current switching cycle Tsw will cause the on duration Ton for the next switching cycle Tsw to increase, resulting in the subharmonic oscillations of the inductor current ILr being likely to occur.

Note that the decreasing slope ma of the inductor current ILr has a predetermined correlation with the absolute signal |Vac| of the AC voltage Vac inputted to the inductor 13, the DC voltage Vdc outputted from the inductor 13, and an inductance of the inductor 13; this correlation can be expressed by the following equation (A):

$$ma = (Vdc - |Vac|)/L \qquad (A)$$

where reference character L represents the inductance of the inductor 13.

The smaller the absolute signal |Vac| of the AC voltage Vac, the larger the absolute value of the decreasing slope ma of the inductor current ILr, resulting in the subharmonic oscillations of the inductor current ILr being likely to occur.

For this reason, for preventing the subharmonic oscillations of the inductor current ILr, the first embodiment makes longer the on duration Ton of the switch SW for each switching cycle Tsw as the absolute signal |Vac| of the AC voltage Vac becomes smaller to thereby alleviate a decrease in the inductor current ILr, making the subharmonic oscillations of the inductor current ILr more difficult.

Specifically, the delay unit 40 sets the delay quantity Td to be larger as a root-mean-square (RMS) Vrms of the AC voltage Vac becomes smaller, and sets the delay quantity Td to be larger as the DC voltage Vdc becomes larger.

The control apparatus 30 includes a storage, such as a memory, and has a first delay quantity map stored in the storage. The first delay quantity map includes information indicative of a relationship among (1) Each of values of the delay quantity Td (2) A corresponding one of combinations, each of which is comprised of a corresponding value of the AC voltage Vac, a corresponding value of the DC voltage Vdc, and a corresponding value of the slope ms That is, the delay unit 40 refers to the first delay quantity map, and extracts a value of the delay quantity Td from the first delay quantity map; the extracted value of the delay quantity Td correlates with a corresponding combination of a corresponding value of the AC voltage Vac, a corresponding value of the DC voltage Vdc, and a corresponding value of the slope ms.

Next, the following describes an example of a method of generating the first delay quantity map indicative of the correspondence relationship between the delay quantity Td and the AC voltage Vac in accordance with FIG. 5.

FIG. 5 illustrates a deviation range parameter $\Delta i$. The deviation range parameter $\Delta i$ according to the first embodiment is defined as a parameter indicative of how the command current IL* is deviated from the average Iave of the inductor current ILr. For this reason, the deviation range parameter $\Delta i$ relative to the average Iave of the inductor current ILr is represented, for each switching cycle Tsw, as the sum of a maximum inductor-current increment $\Delta IL$ relative to the average Iave of the inductor current ILr, which is referred to as ($\Delta IL/2$), and a maximum slope-signal increment $\Delta Slope$ (see FIG. 5). The maximum inductor-current increment $\Delta IL$ represents a maximum increment of the inductor current ILr for each switching cycle Tsw, and the slope-signal increment $\Delta Slope$ represents a maximum increment of the slope compensation signal Slope.

This therefore enables the deviation range parameter $\Delta i$ to be calculated based on the increasing slope mb of the inductor current ILr and the slope ms of the slope compensation signal Slope for each switching cycle Tsw in accordance with the following equation (1):

$$\Delta i = mb \times D \times \frac{Tsw}{2} + ms \times D \times Tsw \tag{1}$$

where reference character D represents the duty factor of the switch SW.

When the AC-DC converter 10 is configured to convert the AC voltage Vac into the DC voltage Vdc, the duty factor D for the switch SW can be expressed by the following equation (2):

$$D = 1 - \frac{|Vac|}{Vdc} \tag{2}$$

In addition, the increasing slope mb of the inductor current ILr, i.e. the positive acceleration of the inductor current ILr, has a predetermined correlation with the absolute signal |Vac| of the AC voltage Vac; this correlation can be expressed by the following equation "mb=|Vac|/L".

Assigning the equation (2) and the correlation "mb=|Vac|/L" to the equation (1) enables the following equation (3) to be derived:

$$\Delta i = \frac{|Vac|}{2L} \cdot \left(1 - \frac{|Vac|}{Vdc}\right) \cdot Tsw + ms \cdot \left(1 + \frac{|Vac|}{Vdc}\right) \cdot Tsw \tag{3}$$

Increasing the inductor current ILr by the deviation range parameter $\Delta i$ enables a degree of distortion in the alternating current Iac to be reduced. In addition, delaying the falling-down timing, i.e. fall time, of the gate signal GS enables the inductor current ILr to increase. For this reason, an increase in the inductor current ILr based on the deviation range parameter $\Delta i$ can be calculated in accordance with the following equation (4):

$$\Delta i = (mb + ms) \times Td \tag{4}$$

Assigning the equation (3) to the deviation range parameter $\Delta i$ of the equation (4) and rearranging the equation (4) to which the equation (3) has been assigned enables the following equation (5) to be calculated:

$$Td = \frac{ms \cdot \left(1 - \frac{|Vac|}{Vdc}\right) + \frac{|Vac|}{2L} \cdot \left(1 - \frac{|Vac|}{Vdc}\right) \cdot Tsw}{\frac{|Vac|}{L} + ms} \tag{5}$$

That is, the first embodiment calculates, in accordance with the equation (5), a value of the delay quantity Td while changing a value of the AC voltage Vac, a value of the DC voltage Vdc, and a value of the slope ms. Then, the first embodiment maps each of the calculated values of the delay quantity Td to (1) A corresponding one of the values of the AC voltage Vac (2) A corresponding one of the values of the DC voltage Vdc (3) A corresponding one of the values of the slope ms This enables the first delay quantity map to be generated.

In particular, the first embodiment maps each of the calculated values of the delay quantity Td to a corresponding RMS of the AC voltage Vac, but can map each of the calculated values of the delay quantity Td to a corresponding amplitude of the AC voltage Vac.

Figure 6:
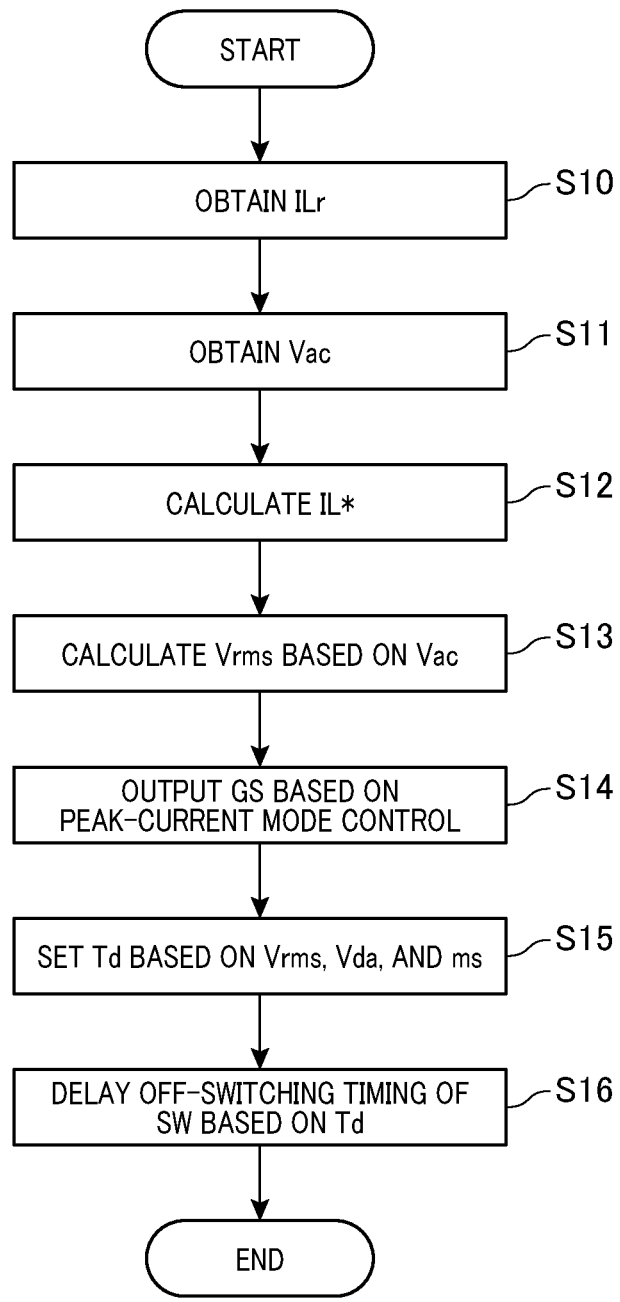
FIG. 6 is a flowchart schematically illustrating a switch control routine based on peak-current mode control.

Next, the following describes a switch control routine of the switch SW on the basis of the peak-current mode control, which is carried out by the control apparatus 30 every predetermined control period with reference to FIG. 6.

The control apparatus 30 serves as a current obtainer to obtain a value of the inductor current ILr measured by the current sensor 32 in step S10. Next, the control apparatus 30 serves as an AC voltage obtainer to obtain a value of the AC voltage Vac measured by the second voltage sensor 33 in step S11.

Subsequently, the control apparatus 30 multiplies the amplitude command Ia* by the reference waveform sin ωt of the AC voltage Vac, thus calculating a value of the pre-correction command current IL* in step S12.

The control apparatus 30 calculates the RMS of the AC power source 200 in accordance with the AC voltage Vac in step S13. Next, the control apparatus 30 performs the peak-current mode control to thereby calculate the gate signal GS as described beforehand with reference to FIG. 2.

Following the operation in step S13, the control apparatus 30 sets, based on the RMS of the AC power source 200 calculated in step S13, the DC voltage Vdc, and the slope ms, a value of the delay quantity Td in step S15.

Specifically, the control apparatus 30 extracts, from the first delay quantity map, a value of the delay quantity Td, which correlates with the obtained value of the AC voltage Vac, a measured value of the DC voltage Vdc, and a setting value of the slope ms in step S15.

Subsequently, in step S16, the control apparatus 30 delays the fall time of the gate signal GS calculated in step S14 by the value of the delay quantity Td set in step S15, resulting in the switching timing of the switch SW from the on state to the off state being delayed by the delay quantity Td. This enables the inductor current ILr to flow through the inductor 13 while distortion contained in the alternating current Iac is suppressed.

After the operation in step S16, the control apparatus 30 terminates a present cycle of the switch control routine.

The following describes how the control apparatus 30 works, and also describes technical benefits achieved by the control apparatus 30 with reference to FIGS. 7A to 7E and FIGS. 8A1 to 8C2.

Figure 7A:
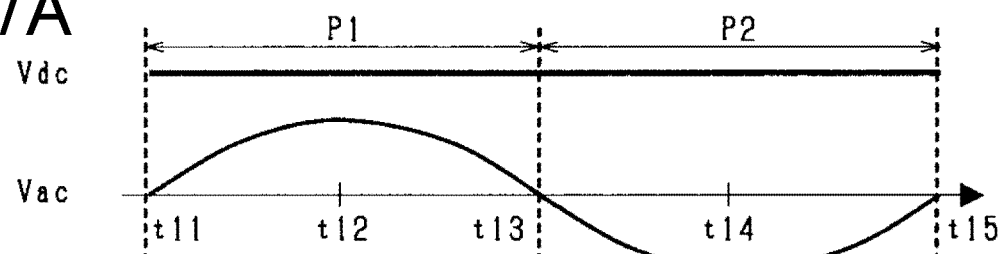
FIGS. 7A to 7E are a joint timing chart of the power conversion system.
Figure 7B:
Figure 7C:
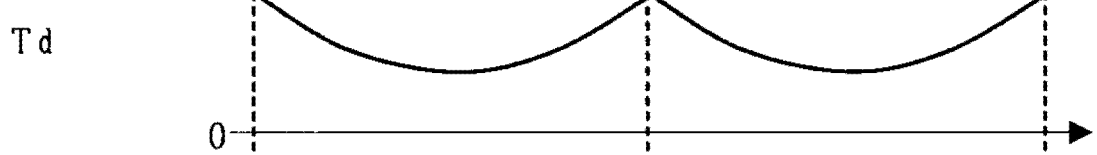
Figure 7D:
Figure 7E:

FIG. 7A schematically illustrates how the AC voltage Vac and the DC voltage Vdc are changed over time, and FIG. 7B schematically illustrates how the gate signal GS is changed over time. FIG. 7C schematically illustrates how the delay quantity Td is changed over time, FIG. 7D schematically illustrates how the inductor current ILr is changed over time, and FIG. 7E schematically illustrates how the alternating current Iac is changed over time.

The first embodiment changes the delay quantity Td in synchronization with change of the AC voltage Vac. Specifically, the first embodiment changes the delay quantity Td such that the delay quantity Td takes (1) A local maximum value each time the AC voltage Vac reaches a corresponding one of the zero-crossing points (see times t11, t13, and t15

(2) A local minimum value each time the AC voltage Vac reaches a corresponding one of the peaks (see times t12 and t14)

This enables the delay quantity Td to be set to the local maximum value each time the AC voltage Vac reaches a corresponding one of the zero-crossing points (t11, t13, t15) at which the deviation range parameter Δi becomes largest. This also enables the delay quantity Td to be set to the local minimum value each time the AC voltage Vac reaches a corresponding one of the peaks (t12, t14) at which the deviation range parameter Δi becomes smallest.

This results in the duty factor of the switch SW being adjusted. This adjustment of the duty factor of the switch SW enables the average Iave of the inductor current ILr to have an absolute sinusoidal wave, resulting in the AC current Iac having a sinusoidal waveform with a suppressed distortion therein.

FIGS. 8A1, 8B1, and 8C1 schematically illustrate how the delay quantity Td, the inductor current ILr, and the alternating current Iac are respectively changed over time according to the first embodiment. In contrast, FIG. 8A2 schematically illustrates the delay quantity Td, which is set to a constant value of zero according to a first comparative example, and FIGS. 8B2 and 8C2 schematically illustrate how the inductor current ILr and the alternating current Iac are respectively changed over time according to the first comparative example.

Note that each of FIGS. 8B and 8E illustrates, as a target average Iave, an average of an ideal inductor current ILr with no distortion.

Because the delay quantity Td is set to zero in the first comparative example as illustrated in FIG. 8A2, FIG. 8B2 shows that the inductor current ILr according to the first comparative example is changed while being maintained to be lower than the target average Iave. This results in the alternating current Iac being distorted at or around each of zero-crossing points at which the AC voltage Vac reaches zero. For example, the total harmonic distortion ratio THD of the alternating current Iac according to the first comparative example is approximately 31%.

In contrast, because the delay quantity Td is changed as the AC voltage Vac is changed in the first embodiment as illustrated in FIG. 8A1, FIG. 8B1 shows that the inductor current ILr according to the first embodiment is changed while following the target average Tave. This results in a reduction of the degree of distortion in the alternating current Iac at or around each of zero-crossing points. For example, the total harmonic distortion ratio THD of the alternating current Iac according to the first embodiment is equal to or less than 0.1%.

The first embodiment described above achieves the following technical benefits.

The control apparatus 30 is configured to perform the peak-current mode control to thereby output the gate signal GS that controls on-off switching operations of the switch SW, thus causing the inductor current ILr to follow the command current IL*. In the peak-current mode control, the control apparatus 30 is specially configured to delay the off-switching timing of the switch SW in accordance with the AC voltage Vac.

This configuration enables changing of the off-switching timing of the switch SW in accordance with the AC voltage Vac, to reduce a degree of distortion in the alternating current Iac. This configuration therefore reduces a processing load of the control apparatus 30 to be lower than a processing load of the control apparatus 30 whose comparative configuration calculates a value of the deviation range parameter Δi and uses the calculated value of the deviation range parameter Δi as the current correction for the inductor current ILr.

The inventors have found that, if the AC voltage Vac is converted into the DC voltage Vdc, the deviation range parameter Δi becomes small each time the AC voltage Vac reaches a corresponding one of zero-crossing points.

Based on the above finding, the control apparatus 30 is configured to control the delay quantity Td such that the delay quantity Td has 1. A negative peak for each of the positive half period P1 and the negative half period P2 of the AC voltage Vac 2. A positive peak between the positive and negative half periods P1 and P2 of the AC voltage Vac This configuration enables the delay quantity Td to change while following change of the deviation range parameter Δi, making it possible to further suppress distortion in the alternating current Iac.

The control apparatus 30 is configured to set the delay quantity Td as a function of the AC voltage Vac and the DC voltage Vdc. This configuration makes it possible to set a value of the delay quantity Td, which is suitable for a value of the DC voltage Vdc, which varies depending on a device connected to the power conversion system 100, thus resulting in distortion in the AC current Iac being further suppressed.

Second Embodiment

The following mainly describes a configuration of the second embodiment, which is different from the above configuration of the first embodiment. The following therefore fails to repeat descriptions of parts in the second embodiment, which are similar to corresponding parts in the first embodiment. To the like parts between the first and second embodiments, identical or like reference characters are assigned.

The circuit structure of the power converter system 100 of the second embodiment is different from the circuit structure of the power converter system 100 of the first embodiment.

Specifically, the power converter system 100 of the second embodiment includes no half-bridge circuits.

Figure 9:
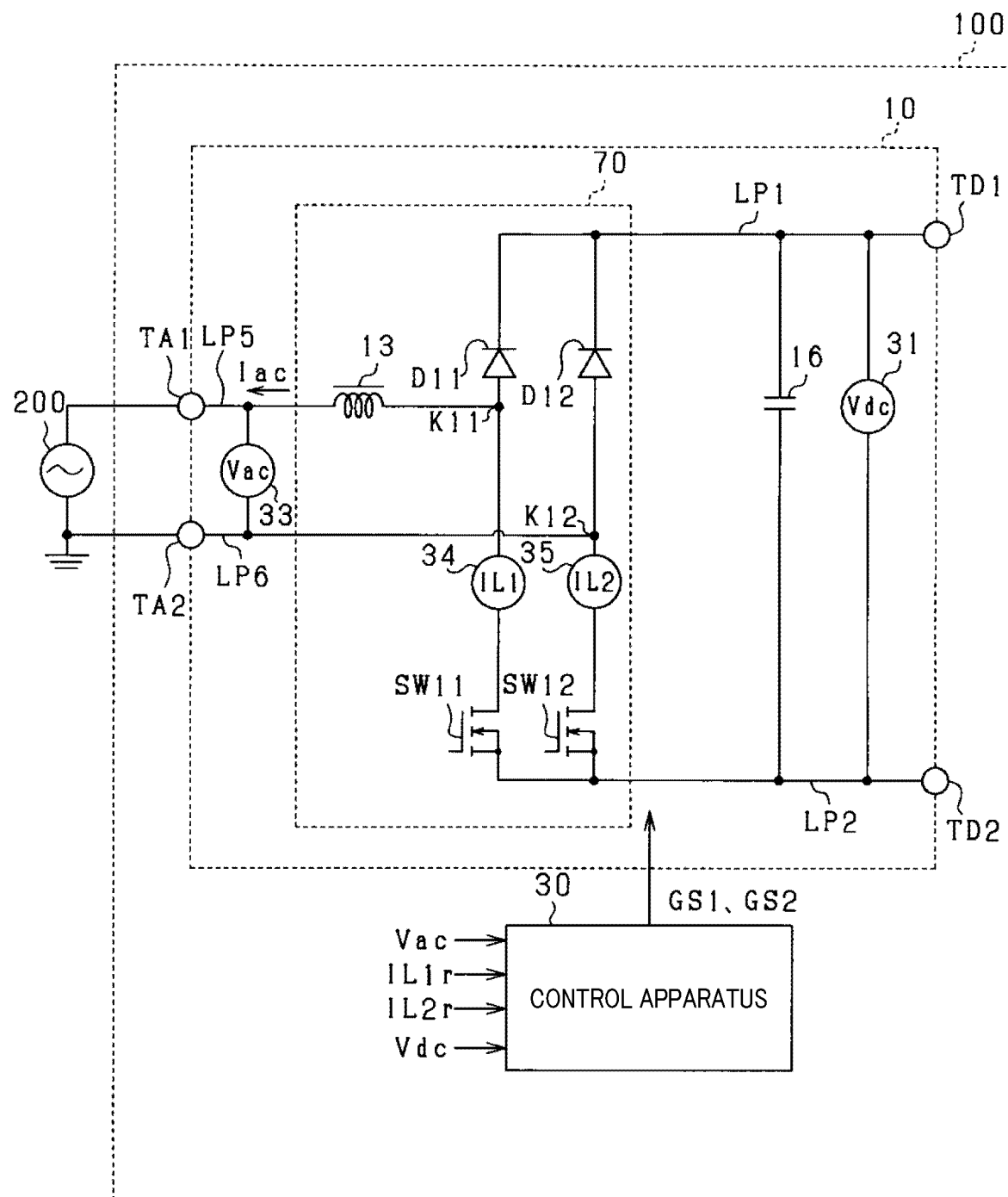
FIG. 9 is a structural diagram of a power conversion system according to the second embodiment.

FIG. 9 schematically illustrates the power converter system 100 of the second embodiment.

The power converter system 100 of the second embodiment includes a full-bridge circuit 70. The full-bridge circuit 70 is connected to the first DC terminal TD1 via the first wiring LP1, and the full-bridge circuit 70 is connected to the second DC terminal TD2 via the second wiring LP2.

Specifically, the full-bridge circuit 70 includes first and second diodes D11 and D12, and first and second switches SW11 and SW12. The second embodiment uses an N-channel MOSFET as each of the first and second switches SW11 and SW12, which is an example of a voltage-controlled switch.

The anode of the first diode D11 is connected to the drain of the first switch SW11. The cathode of the first diode D11 is connected to the first end of the first wiring LP1, and the second end of the first wiring LP1 is connected to the first DC terminal TD1. The source of the first switch SW11 is connected to the first end of the second wiring LP2, and the second end of the second wiring LP2 is connected to the second DC terminal T2.

Similarly, the anode of the second diode D12 is connected to the drain of the second switch SW12. The cathode of the second diode D12 is connected to the first end of the first wiring LP1. The source of the second switch SW12 is connected to the first end of the second wiring LP2.

Each of the first and second switches SW11 and SW12 includes an intrinsic diode connected in antiparallel thereto.

The connection point, which will be referred to as a first connection point K11, between the anode of the first diode D11 and the drain of the first switch SW11 is connected to the first end of the fifth wiring LP5, and the second end of the fifth wiring LP5 is connected to the first AC terminal TA1. Similarly, the connection point, which will be referred to as a second connection point K12, between the anode of the second diode D12 and the drain of the second switch SW12 is connected to the first end of the sixth wiring LP6, and the second end of the sixth wiring LP6 is connected to the second AC terminal TA2.

The power converter system 100 of the second embodiment also includes first and second current sensors 34 and 35. The first current sensor 34 is provided on a connection line between the anode of the first diode D11 and the drain of the first switch SW11. The first current sensor 34 is configured to measure a current flowing through the first switch SW11 as a first inductor current IL1$r$. The second current sensor 35 is provided on a connection line between the anode of the second diode D12 and the drain of the second switch SW12. The second current sensor 35 is configured to measure a current flowing through the second switch SW12 as a second inductor current IL2$r$.

Figure 10:
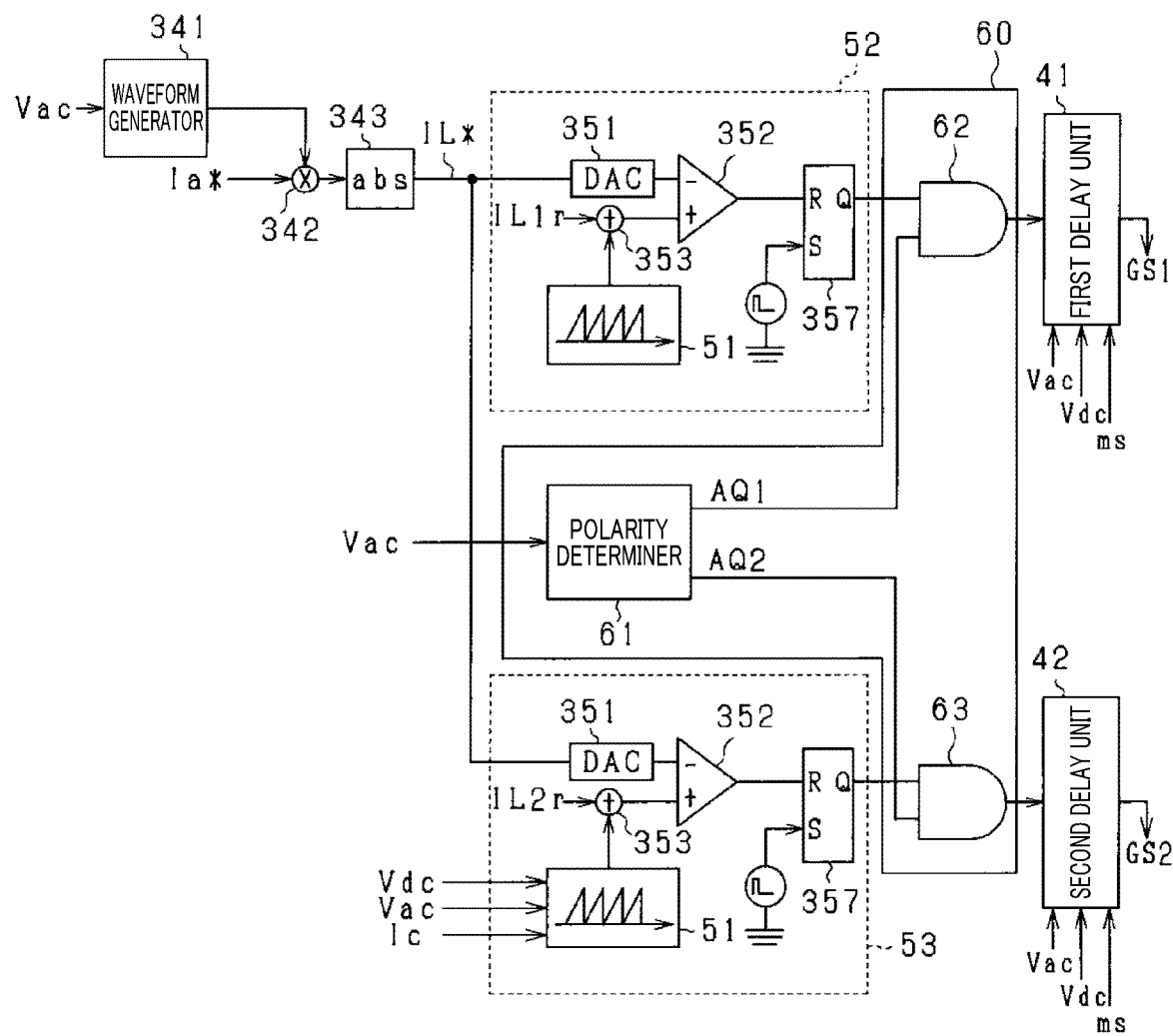
FIG. 10 is a functional block diagram of a control apparatus.

FIG. 10 is a functional block diagram indicative of functions of the control apparatus 30 of the second embodiment.

The control apparatus 30 of the second embodiment functionally includes a first current control unit 52, a second current control unit 53, and a selector 60.

The control apparatus 30 of the second embodiment is configured to perform the peak-current mode control that controls on-off switching operations of each of the first and second switches SW11 and SW12 to thereby adjust the first and second inductor currents IL1$r$ and IL2$r$, whose slopes have been compensated, to follow the command current IL*.

The first current control unit 52 performs the peak-current mode control to thereby cause the first inductor current IL1$r$ whose slope has been compensated to follow the command current IL*. The second current control unit 53 performs the peak-current mode control to thereby cause the second inductor current IL2$r$ whose slope has been compensated to follow the command current IL*.

Because the configuration of each of the first and second current control units 52 and 53 is substantially identical to that of the current control unit 50, descriptions of which are therefore omitted.

The selector 60 is configured to select one of a first gate signal GS1 and a second gate signal GS2 in accordance with the polarity of the AC voltage Vac.

Specifically, the selector 60 includes a polarity determiner 61, a first AND circuit 62, and a second AND circuit 63.

Each of the first and second AND circuits 62 and 63 has first and second input terminals, and the polarity determiner 61 has first and second output terminals connected to the first input terminals of the respective first and second AND circuits 62 and 63. The second input terminal of the first AND circuit 62 is connected to the output terminal of the first current control unit 52. The second input terminal of the second AND circuit 63 is connected to the output terminal of the second current control unit 53.

The polarity determiner 61 is configured to determine whether the AC voltage Vac has a positive polarity or a negative polarity. The polarity determiner 61 is also configured to (1) Output a first selection signal AQ1 with a high level to the first AND circuit 62, and output a second selection signal AQ2 with a low level to the second AND circuit 63 upon determining that the AC voltage Vac has the positive polarity (2) Output the first selection signal AQ1 with the low level to the first AND circuit 62, and output the second selection signal AQ2 with the high level to the second AND circuit 63 upon determining that the AC voltage Vac has the negative polarity The first AND circuit 62, which is connected to the gate of the first switch SW11, outputs the first gate signal GS1 to the gate of the first switch SW11 for turning on or turning off the first switch SW11, and the second AND circuit 63, which is connected to the gate of the second switch SW12, outputs the second gate signal GS2 to the gate of the second switch SW12 for turning on or turning off the second switch SW12.

A first delay unit 41 is connected to the output terminal of the first AND circuit 62. The first delay unit 41 is configured to delay the fall time of the first gate signal GS1 outputted from the first AND circuit 62. A second delay unit 42 is connected to the output terminal of the second AND circuit 63. The second delay unit 42 is configured to delay the fall time of the second gate signal GS2 outputted from the second AND circuit 63.

FIGS. 11A to 11H illustrate timing charts of respective parameters used by the power conversion system 100.

Figures 11A, 11B, 11C, 11D, 11E, 11F, 11G, 11H:
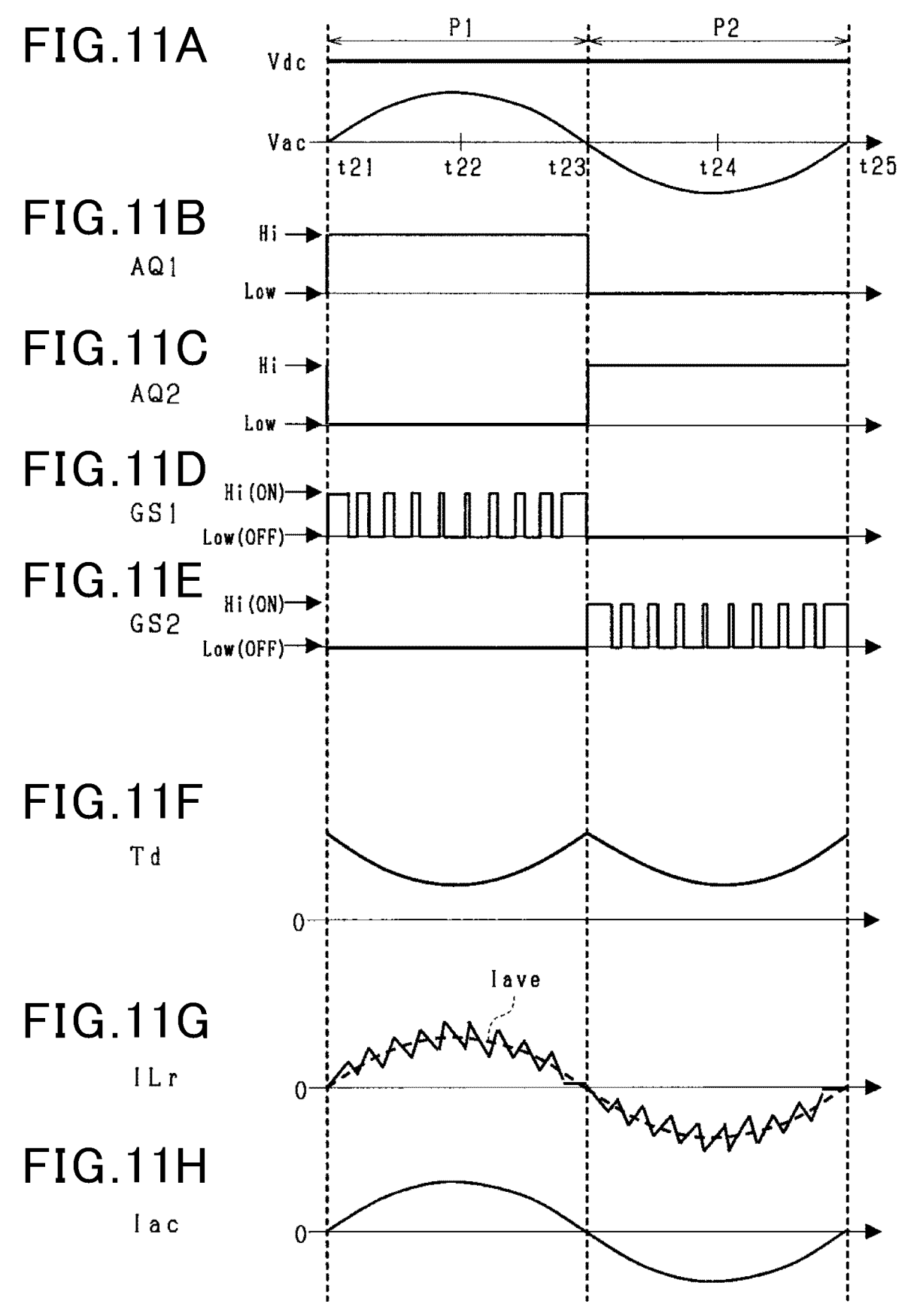

FIG. 11A schematically illustrates how the AC voltage Vac and the DC voltage Vdc are changed over time, FIG. 11B schematically illustrates how the first selection signal AQ1 is changed over time, and FIG. 11C schematically illustrates how the second selection signal AQ2 is changed over time. FIG. 11D schematically illustrates how the first gate signal GS1 is changed over time, and FIG. 11E schematically illustrates how the second gate signal GS2 is changed over time.

FIG. 11F schematically illustrates how the delay quantity Td is changed over time, FIG. 11G schematically illustrates how the inductor current IL is changed over time, and FIG. 11H schematically illustrates how the alternating current Iac is changed over time.

The first selection signal AQ1 with the high level and the second selection signal AQ2 with the low level are input to the respective first and second AND circuits 62 and 63 during the positive half period P1 of the AC voltage Vac. This causes the first current control unit 52 to control the first switch SW11 in accordance with the peak-current mode control.

During the positive half period P1 of the AC voltage Vac, the delay quantity Td set by the first delay unit 41 is changed to take (1) A local maximum value each time the AC voltage Vac reaches a corresponding one of the zero-crossing points (see times t21 and t23)

(2) A local minimum value each time the AC voltage Vac reaches a corresponding one of the peaks (see time t22)

This configuration enables the duty factor of the first switch SW11 to be adjusted while following change of the deviation range parameter $\Delta i$, making it possible to suppress distortion in the alternating current Iac.

As described above, the second embodiment achieves the same technical benefits as those achieved by the first embodiment.

First Modification of the Second Embodiment

Figure 12:
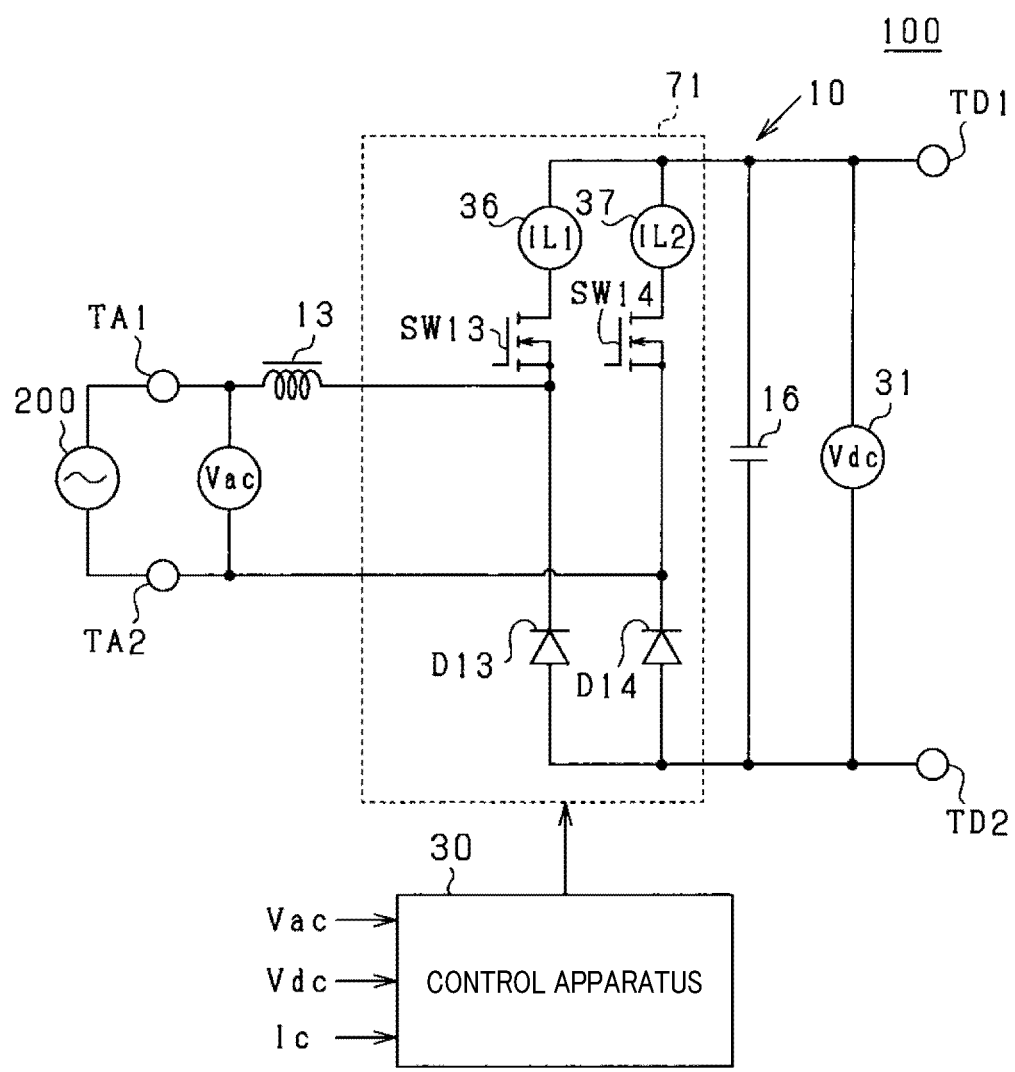
FIG. 12 is a structural diagram of a power conversion system according to a first modification of the second embodiment.

As illustrated in FIG. 12, the first modification of the second embodiment includes a full-bridge circuit 71 whose circuit structure is different from the circuit structure of the full-bridge circuit according to the second embodiment.

The full-bridge circuit 71 of the first modification of the second embodiment includes first and second diodes D13 and D14, and first and second switches SW13 and SW14.

The source of the first switch SW13 is connected to the cathode of the first diode D13, and the source of the second switch SW14 is connected to the cathode of the second diode D14.

The first modification of the second embodiment includes first and second current sensors 36 and 37. The first current sensor 36 is connected to the drain of the first switch SW13, and is configured to measure a current flowing through the first switch SW13 as the first inductor current IL1r. The second current sensor 37 is connected to the drain of the second switch SW14, and is configured to measure a current flowing through the second switch SW14 as the second inductor current IL2r.

Second Modification of the Second Embodiment

Figure 13:
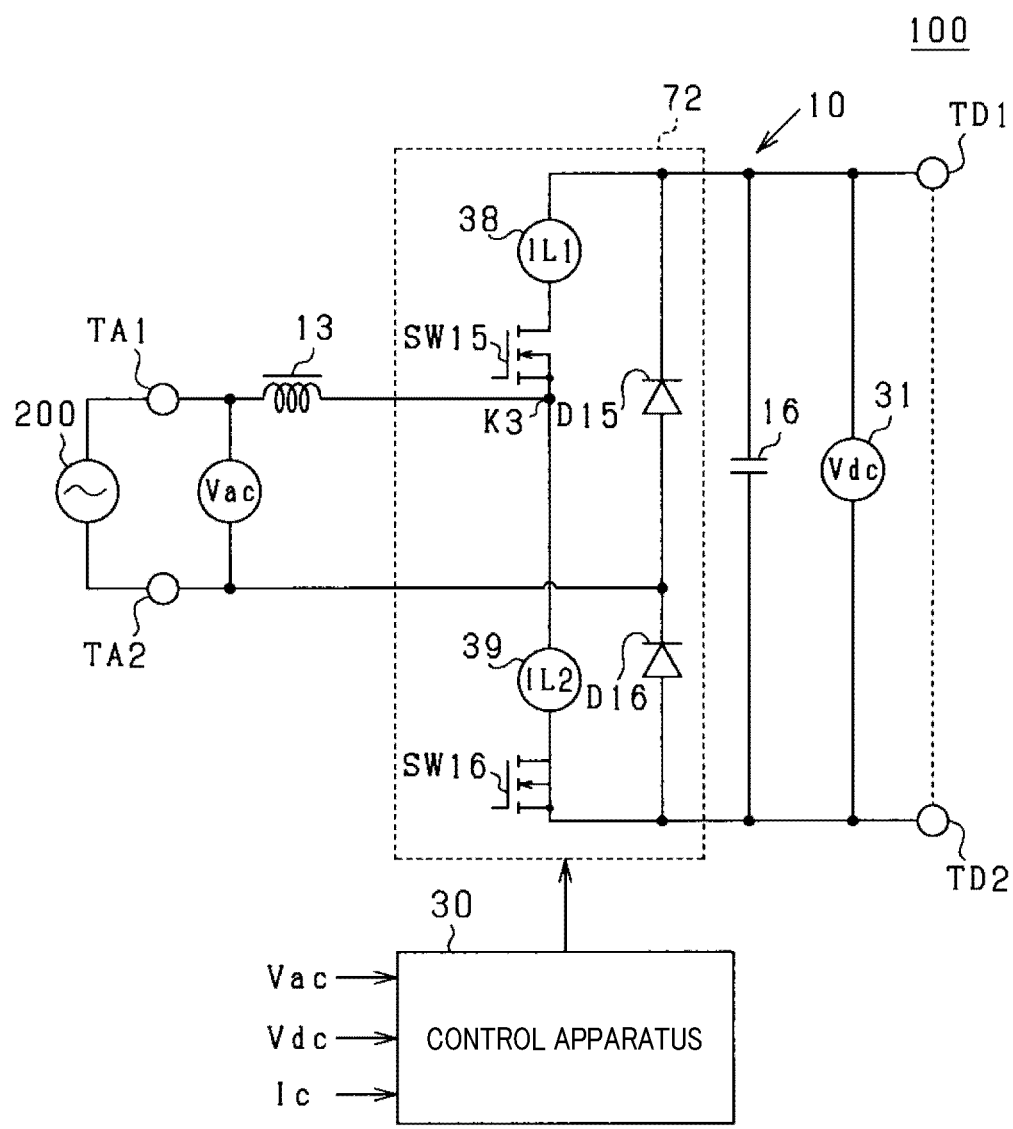
FIG. 13 is a structural diagram of a power conversion system according to a second modification of the second embodiment.

As illustrated in FIG. 13, the second modification of the second embodiment includes a full-bridge circuit 72 whose circuit structure is different from the circuit structure of the full-bridge circuit according to the second embodiment.

The full-bridge circuit 72 of the second modification of the second embodiment includes first and second diodes D15 and D16, and first and second switches SW15 and SW16.

The source of the first switch SW15 is connected to the drain of the second switch SW16. The anode of the first diode D15 is connected to the cathode of the second diode D16.

The second modification of the second embodiment includes first and second current sensors 38 and 39. The first current sensor 38 is connected to the drain of the first switch SW15, and is configured to measure a current flowing through the first switch SW15 as the first inductor current IL1r. The second current sensor 39 is connected to the drain of the second switch SW16, and is configured to measure a current flowing through the second switch SW16 as the second inductor current IL2r.

Third Embodiment

The following mainly describes a configuration of the third embodiment, which is different from the above configuration of the first embodiment. The following therefore fails to repeat descriptions of parts in the third embodiment, which are similar to corresponding parts in the first embodiment. To the like parts between the first and third embodiments, identical or like reference characters are assigned.

The power converter system 100 is configured to convert a DC voltage Vdc into an AC voltage Vac.

Figure 14:
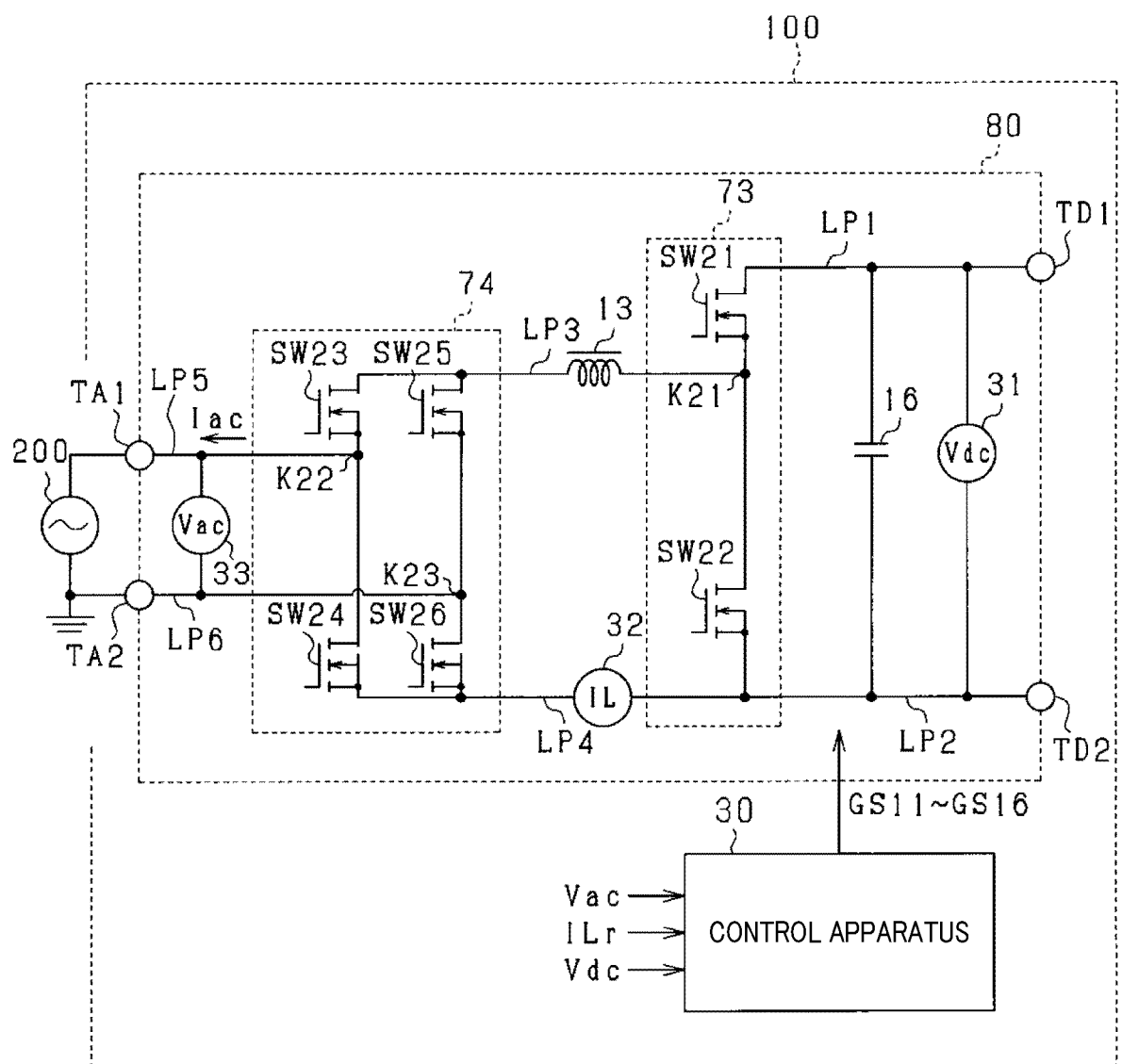
FIG. 14 is a structural diagram of a power conversion system according to the third embodiment.

FIG. 14 schematically illustrates the power converter system 100 of the third embodiment.

The power converter system 100 of the third embodiment includes a DC-AC converter 80.

The DC-AC converter 80 includes the capacitor 16, a half-bridge circuit 73, a full-bridge circuit 74, the inductor 13, and the first to sixth wirings LP1 to LP6. Each of the first to sixth wirings LP1 to LP6 has opposing first and second ends.

The half-bridge circuit 73 includes a first switch SW21 and a second switch SW22. Each of the first and second switches SW21 and SW22 is comprised of, for example, an N-channel MOSFET, which is an example of a voltage-controlled switch. The source of the first switch SW21 is connected to the drain of the second switch SW22. The drain of the first switch SW21 is connected to the first end of the first wiring LP1. The source of the second switch SW22 is connected to the first end of the second wiring LP2. Each of the first and second switches SW21 and SW22 includes an intrinsic diode connected in antiparallel thereto. The first switch SW21 according to the third embodiment serves as a drive switch.

The connection point, which will be referred to as a first connection point K21, between the source of the first switch SW21 and the drain of the second switch SW22, is connected to the second end of the third wiring LP3. The inductor 13 is mounted on the third wiring LP3. The source of the second switch SW22 is connected to the second end of the fourth wiring LP4. The first end of each of the third and fourth switches SW21 and SW22 is connected to the full-bridge circuit 74.

The full-bridge circuit 74 includes third to sixth switches SW23 to SW26. Each of the third to sixth switches SW23 to SW26 is comprised of, for example, an N-channel MOSFET, which is an example of a voltage-controlled switch. The source of the third switch SW23 is connected to the drain of the fourth switch SW24. The source of the fifth switch SW25 is connected to the drain of the sixth switch SW26.

The drain of each of the third and fifth switches SW23 and SW25 is connected to the first end of the third wiring LP3. The source of each of the fourth and sixth switches SW24 to SW26 is connected to the first end of the fourth wiring LP4.

The connection point, which will be referred to as a second connection point K22, between the source of the third switch SW23 and the drain of the fourth switch SW24 is connected to the first end of the fifth wiring LP5, and the second end of the fifth wiring LP5 is connected to the first AC terminal TA1. Similarly, the connection point, which will be referred to as a third connection point K23, between the source of the fifth switch SW25 and the drain of the sixth switch SW26 is connected to the first end of the sixth wiring LP6, and the second end of the sixth wiring LP6 is connected to the second AC terminal TA2.

Figure 15:
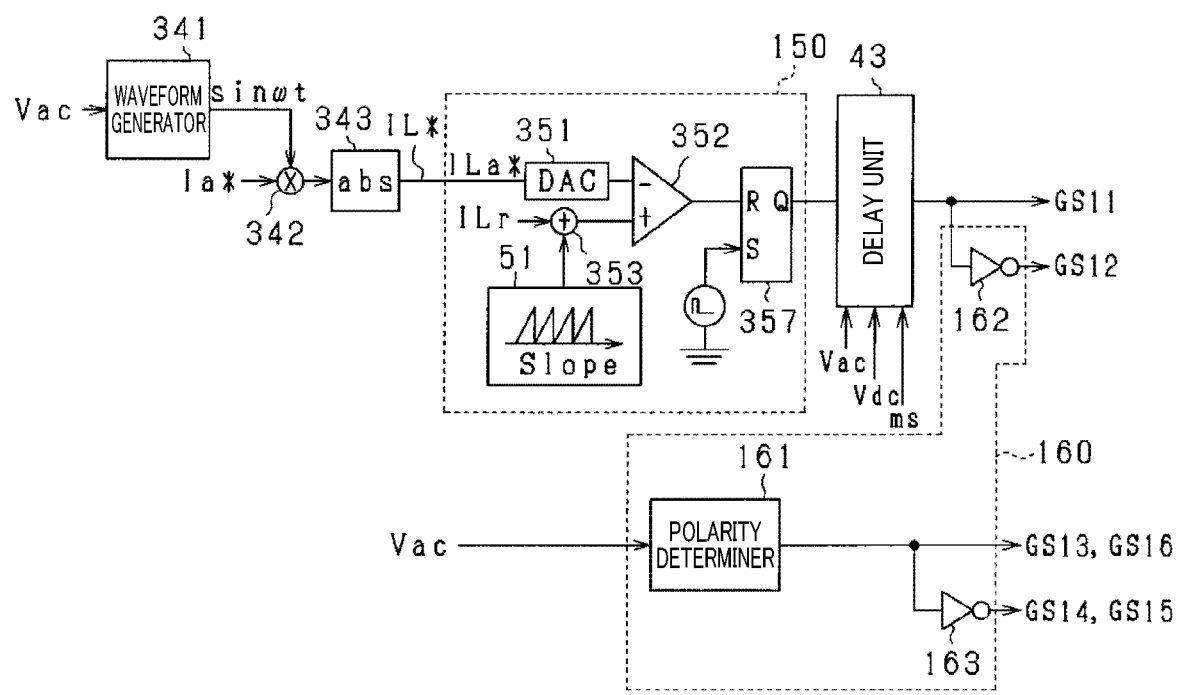
FIG. 15 is a functional block diagram of a control apparatus.

FIG. 15 is a functional block diagram illustrating the functions of the control apparatus 30.

The control apparatus 30 is configured to perform the peak-current mode control to thereby control on-off switching operations of each of the first and second switches SW21 and SW22.

The control apparatus 30 functionally includes a current control unit 150 and a selector 160.

The current control unit 150 is connected to the gate of the first switch SW11, and determines a first gate signal GS11 for the first switch SW11 for on-off control of the first switch SW11 in accordance with the inductor current ILr and the command current IL*, and outputs the first gate signal GS11 to the gate of the first switch SW11.

The selector 160 includes a polarity determiner 161, a first inverter gate 162, and a second inverter gate 163.

The current control unit 150 is connected to the gate of the second switch SW22 via the first inverter 162, and is configured to output a second gate signal GS12 via the first inverter 162.

The polarity determiner 161 is configured to determine whether the AC voltage Vac has a positive polarity or a negative polarity. The polarity determiner 161 is also configured to (1) Output an output signal with a low level upon determining that the AC voltage Vac has the positive polarity (2) Output the output signal with a high level upon determining that the AC voltage Vac has the negative polarity The polarity determiner 161 is connected to the gate of each of the third and sixth switches SW23 and SW26, so that the polarity determiner 161 outputs the output signal to the third switch SW23 as a third gate signal GS13 and to the sixth switch SW26 as a sixth gate signal GS16.

The polarity determiner 161 is also connected via the second inverter gate 163 to the gate of each of the fourth and fifth switches SW24 and SW25, so that the polarity determiner 161 outputs, via the second inverter gate 163, the output signal to the fourth switch SW24 as a fourth gate signal GS14 and to the fifth switch SW25 as a fifth gate signal GS15. Each of the fourth and fifth gate signals GS14 and 15 has one of the high level and the low level, which is the inverse of the level of each of the third and sixth gate signals GS13 and GS16.

A delay unit 43 is connected between the output terminal of the current control unit 150 and the gate of each of the first and second switches SW11 and SW12. The delay unit 43 is configured to delay the fall time of each of the first and second gate signals GS11 and GS12. Specifically, the output terminal of the delay unit 43 is connected to the gate of the first switch SW21 and the first inverter 162, and the output terminal of the first inverter 162 is connected to the gate of the second switch SW22.

Figure 16A:
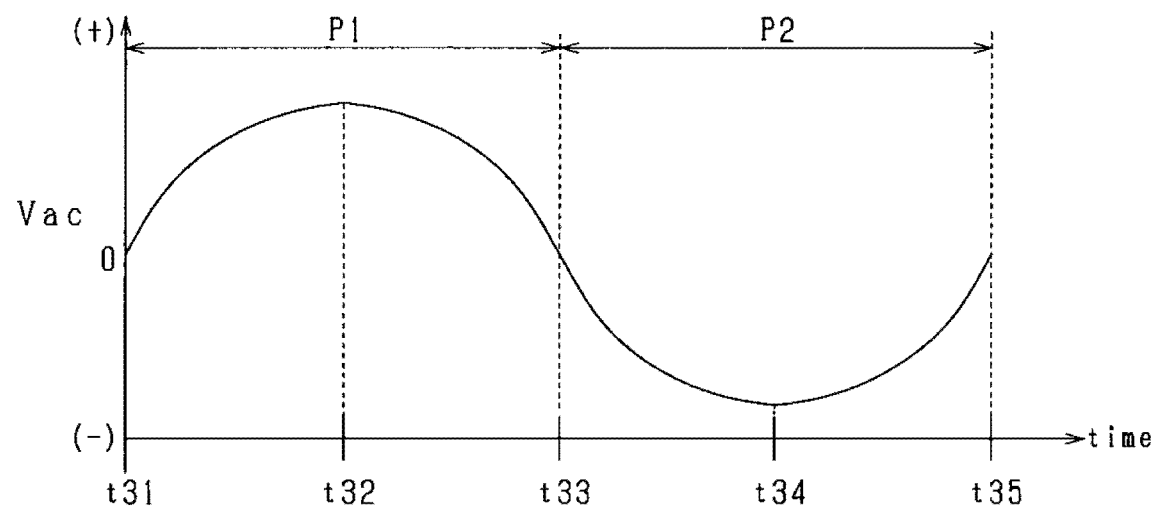
FIGS. 16A and 16B are each a graph used to describe a delay quantity that is set based on an alternating-current voltage.
Figure 16B:
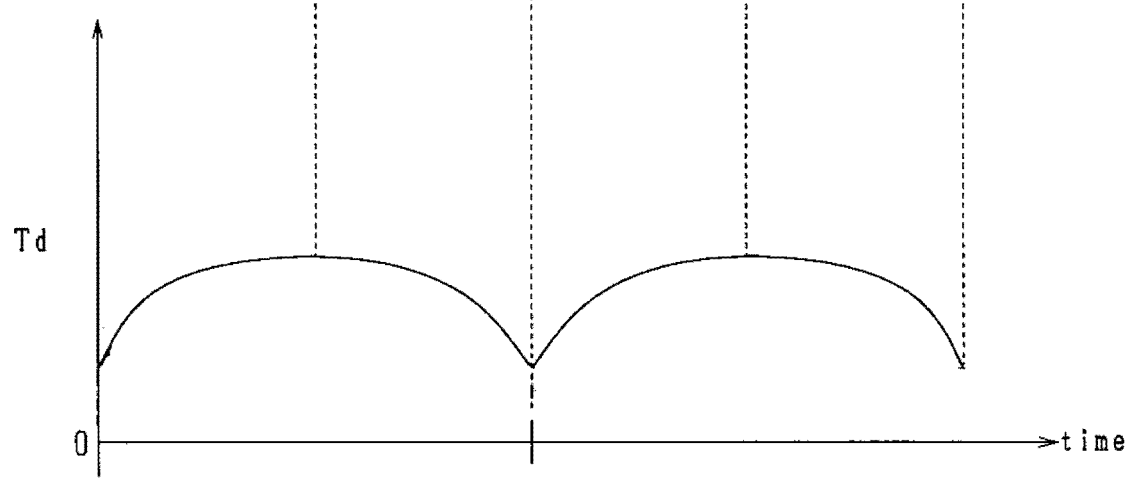

FIGS. 16A and 16B are used to show how the delay quantity 150 set by the delay unit 150 of the third embodiment is changed over time.

The inventors have found that, if the DC voltage Vdc is converted into the AC voltage Vac by the DC-AC converter 80, the deviation range parameter Δi indicative of how the command current IL* is deviated from the average Iave of the inductor current ILr takes a smallest value each time the AC voltage Vac reaches a corresponding one of zero-crossing points (see times t31, t33, and t35). In contrast, the inventors have found that, if the DC voltage Vdc is converted into the AC voltage Vac by the DC-AC converter 80, the deviation range parameter Δi takes a largest value each time the AC voltage Vac is located equal to or close to a corresponding one of peaks (see times t32 and t34).

Based on the above finding, as illustrated in FIG. 16B, the third embodiment is configured to control the delay unit Td such that the delay unit Td changes to (1) Take a local minimum value each time the AC voltage Vac reaches a corresponding one of the zero-crossing points (see the times t31, t33, and t35)

(2) Take a local maximum value each time the AC voltage Vac reaches a corresponding one of the peaks (see the times t32 and t34)

In particular, the delay unit 43 of the third embodiment sets the delay unit Td for each period of the AC voltage Vac such that the delay unit Td has 1. The local maximum value for each of the positive half period P1 and the negative half period P2 of the AC voltage Vac 2. The local minimum value between the positive and negative half periods P1 and P2 of the AC voltage Vac The control apparatus 30 of the third embodiment has a second delay quantity map stored in the storage; the second delay quantity map includes information indicative of a relationship among (1) Each of values of the delay quantity Td (2) A corresponding value of the AC voltage Vac (3) A corresponding value of the slope ms That is, the delay unit 43 refers to the second delay-quantity map, and extracts a value of the delay quantity Td from the second delay quantity map; the extracted value of the delay quantity Td correlates with a corresponding value of the AC voltage Vac and a corresponding value of the slope ms.

Next, the following describes an example of a method of generating the second delay quantity map according to the third embodiment.

When the DC-AC converter 80 is configured to convert the DC voltage Vdc into the AC voltage Vac, the duty factor D for the switch SW can be expressed by the following equation (6):

$$D = \frac{|Vac|}{Vdc} \quad (6)$$

In addition, the increasing slope mb of the inductor current ILr has a predetermined correlation with the DC voltage Vdc and the absolute signal |Vac| of the AC voltage Vac; this correlation can be expressed by the following equation "mb=(Vdc−|Vac|)/L"

Assigning the equation (6) and the correlation "mb= (Vdc−|Vac|)/L" to the equation (1) enables the following equation (7) to be derived:

$$\Delta i = \frac{Vdc - |Vac|}{2L} \cdot \left(\frac{|Vac|}{Vdc}\right) \cdot Tsw + ms \cdot \left(\frac{|Vac|}{Vdc}\right) \cdot Tsw \quad (7)$$

An increase in the inductor current ILr based on the deviation range parameter Δi can be calculated in accordance with the above equation (4).

Assigning the equation (7) to the deviation range parameter Δi of the equation (4) and rearranging the equation (4) to which the equation (7) has been assigned enables the following equation (8) to be calculated:

$$Td = \frac{ms \cdot \frac{|Vac|}{Vdc} \cdot Tsw + \frac{Vdc - |Vac|}{2L} \cdot \frac{|Vac|}{Vdc} \cdot Tsw}{\frac{Vdc - |Vac|}{L} + ms} \quad (8)$$

That is, the third embodiment calculates, in accordance with the equation (8), a value of the delay quantity Td while changing a value of the AC voltage Vac, a value of the DC voltage Vdc, and a value of the slope ms. Then, the third embodiment maps each of the calculated values of the delay quantity Td to (1) A corresponding one of the values of the AC voltage Vac (2) A corresponding one of the values of the DC voltage Vdc (3) A corresponding one of the values of the slope ms This enables the second delay quantity map to be generated.

In particular, like the first embodiment, the third embodiment maps each of the calculated values of the delay quantity Td to a corresponding RMS of the AC voltage Vac, but can map each of the calculated values of the delay quantity Td to a corresponding amplitude of the AC voltage Vac.

Next, the following describes how the power conversion system 100 works.

FIGS. 17A to 17E illustrate timing charts of respective parameters used by the power conversion system 100 of the third embodiment.

Figure 17A:
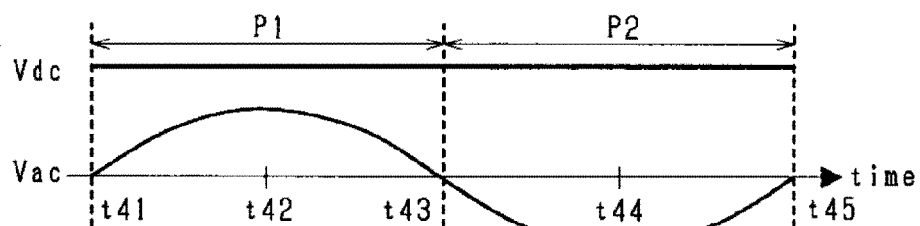
FIGS. 17A to 17E are a joint timing chart of the power conversion system.
Figure 17B:

FIG. 17A schematically illustrates how the AC voltage Vac and the DC voltage Vdc are changed over time, and FIG. 17B schematically illustrates how the first gate signal GS11 is changed over time. Note that the second gate signal GS12 is changed such that the level of the second gate signal GS12 is opposite to the high or low level of the first gate signal GS11.

Figure 17C:
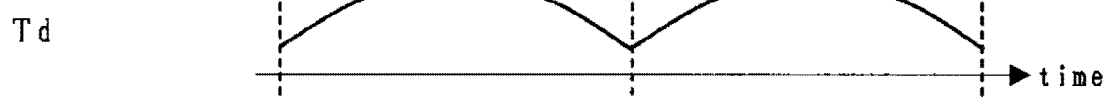
Figure 17D:
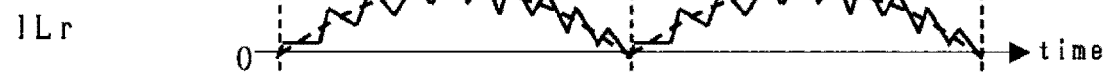
Figure 17E:

FIG. 17C schematically illustrates how the delay quantity Td is changed over time, and FIG. 17D schematically illustrates how the inductor current ILr is changed over time, and FIG. 17E schematically illustrates how the alternating current Iac is changed over time.

The fourth and fifth gate signals GS14 and GS15 are in the high level while the AC voltage Vac has the positive polarity within the positive half period P1, causing the fourth and fifth switches SW24 and SW25 to be in the on state, i.e. the closed state.

The third and sixth gate signals GS13 and GS16 are in the low level while the AC voltage Vac has the positive polarity within the positive half period P1, causing the third and sixth switches SW23 and SW26 to be in the off state, i.e. the open state.

For this reason, the peak-current mode control performed by the current control unit 150 within the positive half period P1 causes the first gate signal GS11 to be in the low level while the second gate signal GS12 is at the high level, resulting in a closed loop, which includes the fourth and fifth switches SW24 and SW25, the inductor 13, and the second switch SW22, being generated.

The fourth and fifth gate signals GS14 and GS15 are in the low level while the AC voltage Vac has the negative polarity within the negative half period P2, causing the fourth and fifth switches SW24 and SW25 to be in the off state, i.e. the open state.

The third and sixth gate signals GS13 and GS16 are in the high level while the AC voltage Vac has the negative polarity within the negative half period P2, causing the third and sixth switches SW23 and SW26 to be in the on state, i.e. the closed state.

For this reason, the current control unit 150 causes the first gate signal GS11 to be at the low level while the second gate signal GS12 is at the high level within the negative half period P2, resulting in a closed loop, which includes the third and fifth switches SW23 and SW26, the inductor 13, and the second switch SW22, being generated.

In particular, the delay unit 43 changes the delay quantity Td such that the delay quantity Td takes (1) A local minimum value each time the AC voltage Vac reaches a corresponding one of the zero-crossing points (see times t41, t43, and t45)

(2) A local maximum value each time the AC voltage Vac reaches a corresponding one of the peaks (see times t42 and t44)

This configuration enables the delay quantity Td to be set to the local maximum value each time the AC voltage Vac reaches a corresponding one of the zero-crossing points t which the deviation range parameter Δi becomes largest. This also enables the delay quantity Td to be set to the local minimum value each time the AC voltage Vac reaches a corresponding one of the peaks at which the deviation range parameter Δi becomes smallest.

This results in the duty factor of each of the first and second switches SW21 and SW22 being adjusted. This adjustment of the duty factor of each of the first and second switches SW21 and SW22 results in the AC current Iac with a suppressed distortion therein.

FIGS. 18A1, 18B1, and 18C1 schematically illustrate how the delay quantity Td, the inductor current ILr, and the alternating current Iac are respectively changed over time according to the third embodiment. In contrast, FIG. 18A2 schematically illustrates the delay quantity Td, which is set to a constant value of zero according to a second comparative example, and FIGS. 18B2 and 18C2 schematically illustrate how the inductor current ILr and the alternating current Iac are respectively changed over time according to the second comparative example.

Because the delay quantity Td is set to zero in the second comparative example as illustrated in FIG. 18A2, the inductor current ILr according to the second comparative example is changed while being maintained to be lower than the target average Tave. This results in the alternating current Iac being distorted as illustrated in FIG. 18C. For example, the total harmonic distortion ratio THD of the alternating current Iac according to the second comparative example is approximately 7%.

In contrast, because the delay quantity Td is changed as the AC voltage Vac is changed in the third embodiment as illustrated in FIG. 18A1, the inductor current ILr according to the third embodiment is changed while following the target average Tave. This results in a reduction of the degree of distortion in the alternating current Iac. For example, the total harmonic distortion ratio THD of the alternating current Iac according to the third embodiment is equal to or less than 1.7%.

As described above, the control apparatus 30 of the third embodiment is applied to the power conversion system 100 for converting the DC voltage Vdc into the AC voltage Vac. During power conversion of the DC voltage Vdc into the AC voltage Vac, the value of the deviation range parameter Δi becomes small each time the AC voltage Vac reaches a corresponding one of zero-crossing points or thereabout, and the value of the deviation range parameter Δi becomes large each time the AC voltage Vac reaches a corresponding one of peaks or thereabout.

From this viewpoint, the control apparatus 30 changes the delay quantity Td such that the delay quantity Td takes (1) A local maximum value for each of the positive and negative half periods of the AC voltage Vac (2) A local minimum value for each interval between a corresponding positive peak of the AC voltage Vac for a corresponding positive half period P1 and a corresponding negative peak of the AC voltage Vac for a corresponding negative half period P2

This configuration achieves the same technical benefits as those achieved by the first embodiment in a case where the power conversion system 100 is configured to convert the DC voltage Vdc into the AC voltage Vac.

Fourth Embodiment

The following mainly describes a configuration of the fourth embodiment, which is different from the above configuration of the third embodiment. The following therefore fails to repeat descriptions of parts in the fourth embodiment, which are similar to corresponding parts in the third embodiment. To the like parts between the third and fourth embodiments, identical or like reference characters are assigned.

The circuit structure of the power converter system 100 of the fourth embodiment is different from the circuit structure of the power converter system 100 of the third embodiment. Specifically, the power converter system 100 of the fourth embodiment includes no half-bridge circuits.

Figure 19:
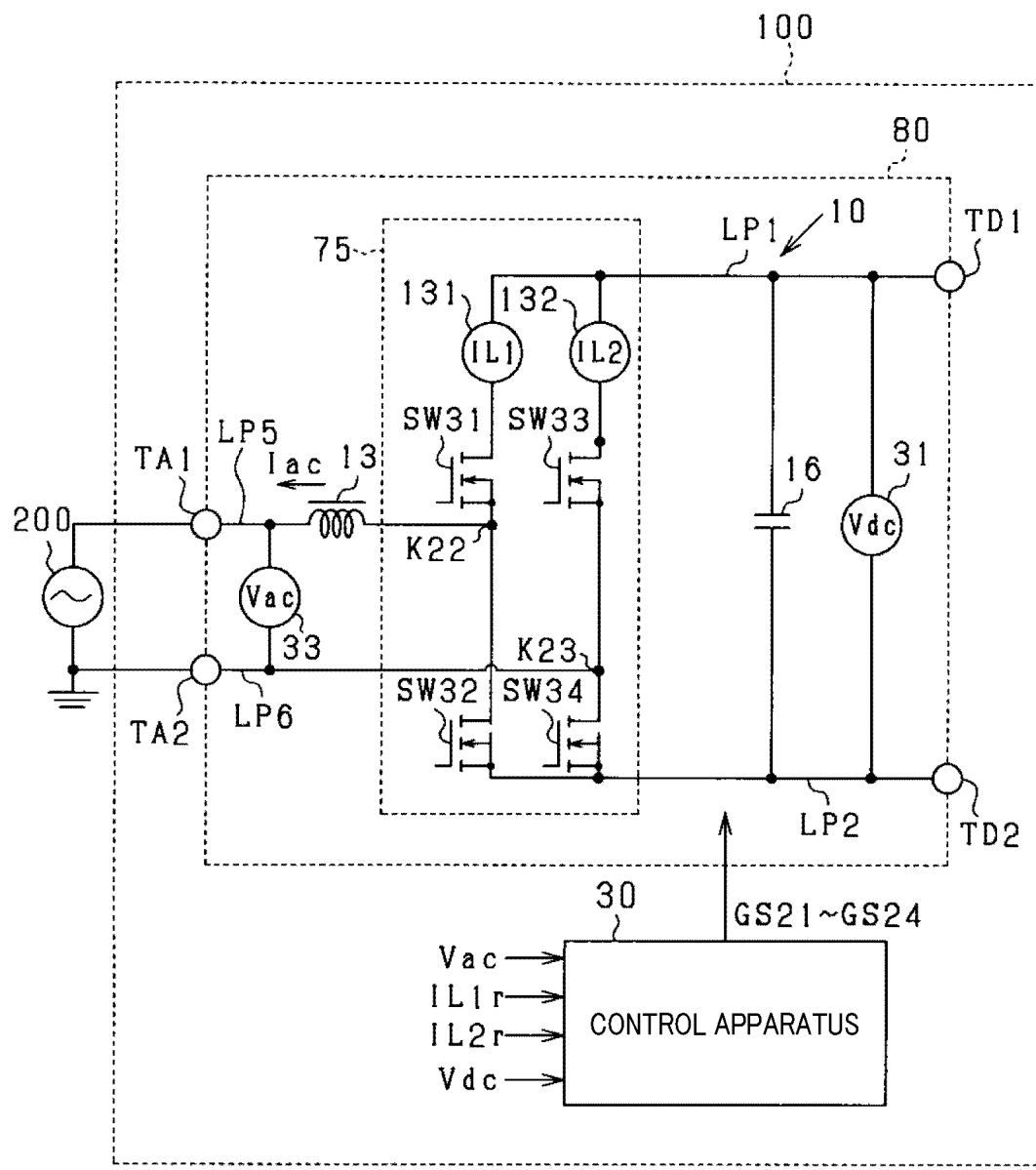
FIG. 19 is a structural diagram of a power conversion system according to the fourth embodiment.

FIG. 19 schematically illustrates the power converter system 100 of the fourth embodiment.

The power converter system 100 of the fourth embodiment includes a full-bridge circuit 75. The full-bridge circuit 75 is connected to the first DC terminal TD1 via the first wiring LP1, and the full-bridge circuit 70 is connected to the second DC terminal TD2 via the second wiring LP2.

Specifically, the full-bridge circuit 75 includes first to fourth switches SW31 to SW34. The fourth embodiment uses an N-channel MOSFET as each of the first to fourth switches SW31 and SW34, which is an example of a voltage-controlled switch. Because the first to fourth switches SW31 to SW34 correspond to the respective first to fourth switches SW23 to SW26 according to the third embodiment, the descriptions of these switches SW31 to SW34 are omitted.

The power converter system 100 of the fourth embodiment also includes first and second current sensors 131 and 132.

The first current sensor 131 is connected to the drain of the first switch SW31, and is configured to measure a current flowing through the first switch SW31 as a first inductor current IL1r. The second current sensor 132 is connected to the drain of the third switch SW33, and is configured to measure a current flowing through the third switch SW33 as a second inductor current IL2r.

Figure 20:
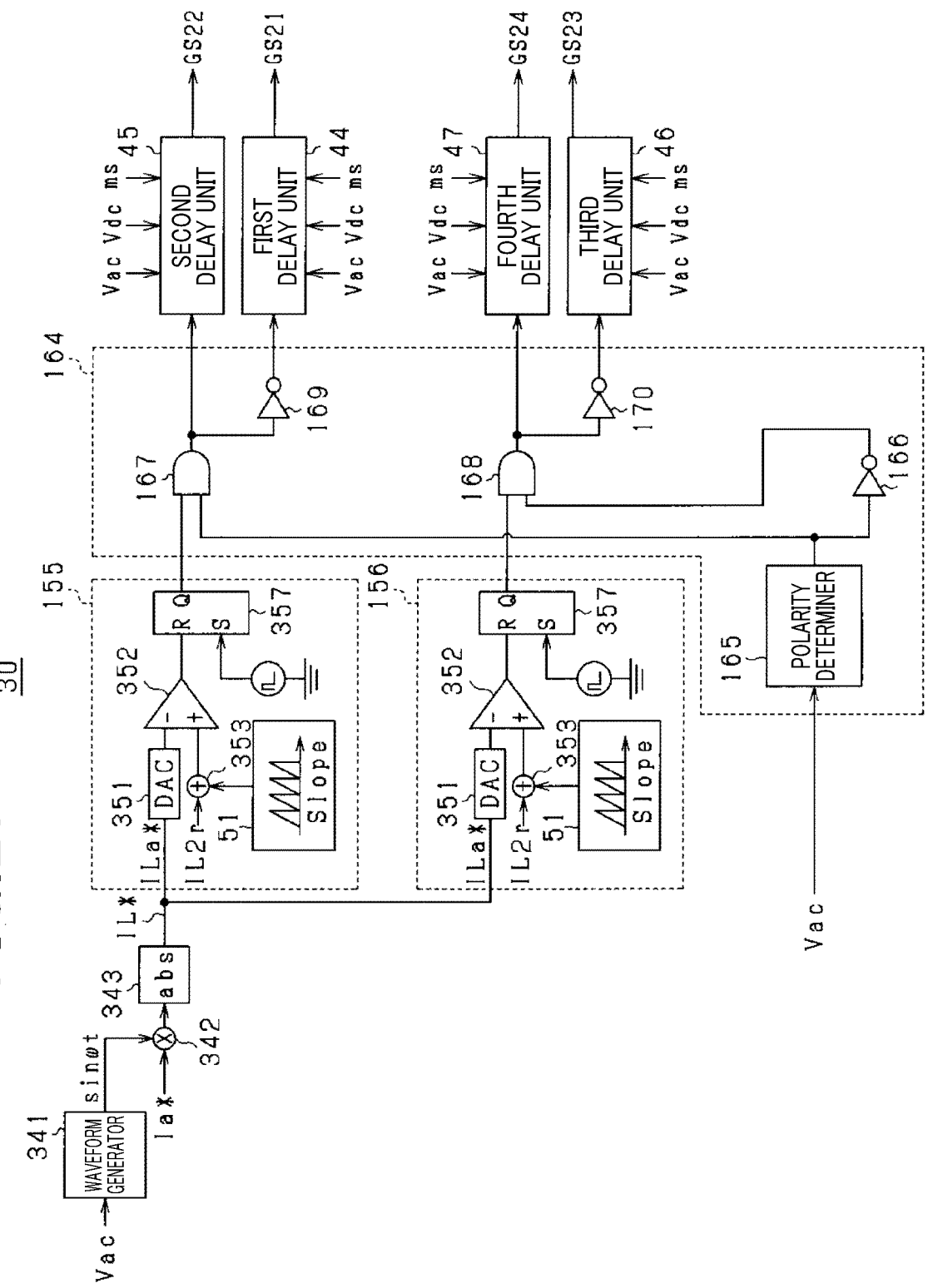
FIG. 20 is a functional block diagram of a control apparatus.

FIG. 20 is a functional block diagram indicative of functions of the control apparatus 30 of the fourth embodiment.

The control apparatus 30 of the fourth embodiment is configured to perform the peak-current mode control that controls on-off switching operations of each of the first to fourth switches SW31 to SW34.

The control apparatus 30 of the fourth embodiment functionally includes a first current control unit 155, a second current control unit 156, and a selector 164.

The first current control unit 155 performs the peak-current mode control to thereby cause the first inductor current IL1r whose slope has been compensated to follow the command current IL*. The second current control unit 156 performs the peak-current mode control to thereby cause the second inductor current IL2r whose slope has been compensated to follow the command current IL*.

Each of the first and second current control units 155 and 156 serves as a drive signal outputting unit. Because the configuration of each of the first and second current control units 155 and 156 is substantially identical to that of the current control unit 50, descriptions of which are therefore omitted.

The selector 164 includes a polarity determiner 165, a first AND circuit 167, a second AND circuit 168, and first to third inverter gates 166, 169, and 170.

Each of the first and second AND circuits 167 and 168 has first and second input terminals, the polarity determiner 165 has an output terminal, and each of the first to third inverter gates 166, 169, and 170 has opposing input and output terminals. The output terminal of the polarity determiner 165 is connected to the first input terminal of the first AND circuit 167, and to the input terminal of the first inverter gate 166. The output terminal of the first inverter gate 166 is connected to the first input terminal of the second AND circuit 168. The second input terminal of the first AND circuit 167 is connected to the output terminal of the first current control unit 155. The second input terminal of the second AND circuit 168 is connected to the output terminal of the second current control unit 156.

The first AND circuit 167 is connected to the gate of the second switch SW32, and is also connected to the gate of the first switch SW31 via the second inverter gate 169. The first AND circuit 167 is configured to output the second gate signal GS22 to the gate of the second switch SW22, and output the first gate signal GS21 via the second inverter gate 169; the first gate signal GS21 is configured as the inverse of the second gate signal GS22.

The second AND circuit 168 is connected to the gate of the fourth switch SW34, and is also connected to the gate of the third switch SW33 via the third inverter gate 170. The second AND circuit 168 is configured to output the fourth gate signal GS24 to the gate of the fourth switch SW23, and output the third gate signal GS23 via the third inverter gate 170; the third gate signal GS23 is configured as the inverse of the fourth gate signal GS24.

A first delay unit 44 is connected between the second inverter gate 169 and the gate of the first switch SW31. The first delay unit 44 is configured to delay the fall time of the first gate signal GS21 to the low level.

A second delay unit 45 is connected between the output terminal of the first AND circuit 167 and the gate of the second switch SW32. The second delay unit 45 is configured to delay the fall time of the second gate signal GS22.

A third delay unit 46 is connected between the output terminal of the third inverter gate 170 and the gate of the third switch SW33. The third delay unit 46 is configured to delay the fall time of the third gate signal GS23.

A fourth delay unit 47 is connected between the output terminal of the second AND circuit 168 and the gate of the fourth switch SW34. The fourth delay unit 47 is configured to delay the fall time of the fourth gate signal GS24.

Like the third embodiment, each of the first to fourth delay units 44 to 47 is configured to set a value of the delay quantity Td as a function of a corresponding value of the RMS VI ins of the AC voltage Vac, a corresponding value of the DC voltage Vdc, and a corresponding value of the slope ms.

FIGS. 21A to 21E illustrate timing charts of respective parameters used by the power conversion system 100 of the fourth embodiment.

Figure 21A:
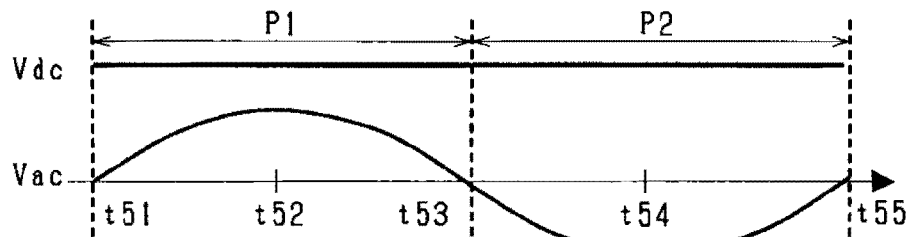
Figure 21B:

FIG. 21A schematically illustrates how the AC voltage Vac and the DC voltage Vdc are changed over time, and FIG. 21B schematically illustrates how the first gate signal GS21 is changed over time.

Figure 21C:
Figure 21D:
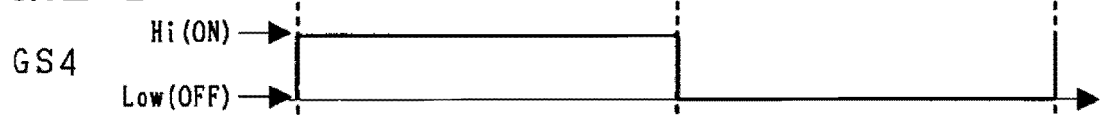

FIG. 21C schematically illustrates how the third gate signal GS23 is changed over time, and FIG. 21D schematically illustrates how the fourth gate signal GS24 is changed over time.

Note that the waveform of the second gate signal GS22 is identical to the inverse of the waveform of the fourth gate signal GS24.

Figure 21E:
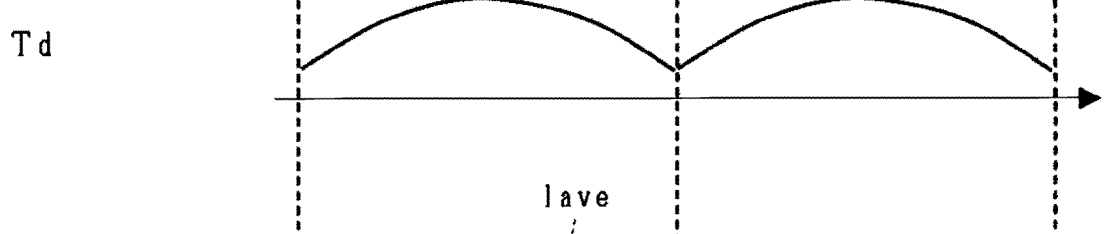
Figure 21F:
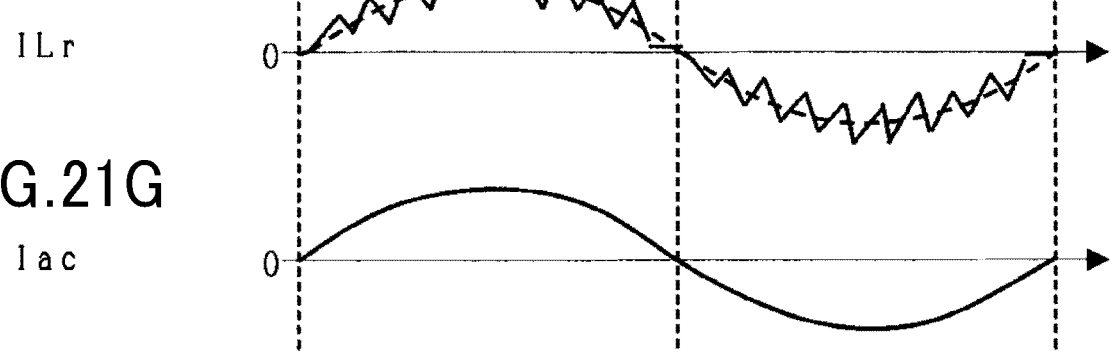

FIG. 21E schematically illustrates how the delay quantity Td is changed over time, and FIG. 21F schematically illustrates how the inductor current ILr is changed over time, and FIG. 21G schematically illustrates how the alternating current Iac is changed over time.

The control apparatus 30 causes the fourth gate signal GS24 to be in the high level and the second gate signal GS22 to be in the low level while the AC voltage Vac has the positive polarity within the positive half period P1.

The peak-current mode control carried out by the first current control unit 155 within the positive half period P1 causes the first gate signal GS21 to be outputted; the first gate signal GS21 is to cause the first inductor current IL1$r$ whose slope has been compensated to follow the command current IL*.

In particular, each of the first and second delay units 44 and 45 changes the delay quantity Td such that the delay quantity Td takes (1) A local minimum value each time the AC voltage Vac reaches a corresponding one of the zero-crossing points (see times t51, t53)

(2) A local maximum value each time the AC voltage Vac reaches a corresponding one of the peaks (see time t52)

This configuration enables the duty factor of the first switch SW31 to be adjusted. This adjustment of the duty factor of the first switch SW31 results in the AC current Iac with a suppressed distortion therein for the positive half period P1.

The control apparatus 30 causes the fourth gate signal GS24 to be in the low level and the second gate signal GS22 to be in the high level while the AC voltage Vac has the negative polarity within the negative half period P2.

The peak-current mode control carried out by the second current control unit 156 within the negative half period P2 causes the third gate signal GS23 to be outputted; the third gate signal GS23 is to cause the second inductor current IL2$r$ whose slope has been compensated to follow the command current IL*.

In particular, each of the third and fourth delay units 46 and 47 changes the delay quantity Td such that the delay quantity Td takes (1) A local minimum value each time the AC voltage Vac reaches a corresponding one of the zero-crossing points (see time t55)

(2) A local maximum value each time the AC voltage Vac reaches a corresponding one of the peaks (see time t54)

This configuration enables the duty factor of the third switch SW33 to be adjusted. This adjustment of the duty factor of the third switch SW33 results in the AC current Iac with a suppressed distortion therein for the negative half period P2.

The fourth embodiment therefore achieves the same technical benefits as those achieved by the third embodiment.

Modifications

Figure 22:
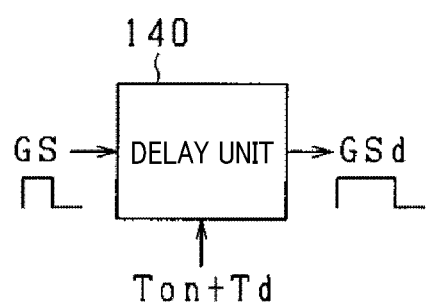
FIG. 22 is a diagram illustrating a delay unit according to a modification.

Each of the delay units described above can be designed as a delay unit 140, which is comprised of a monostable multivibrator illustrated in FIG. 22.

The delay unit 140 is configured to output, as a delayed gate signal GSd, a pulse signal to the gate of a corresponding switch SW; the pulse signal is turned to the high level in synchronization with the rising timing of the gate signal GS outputted in the control unit 30. The delay unit 140 is configured to set a high duration (an on duration) of the delayed pulse signal GSd to the sum of the on duration Ton of the gate signal GS and the delay quantity Td, thus enabling the corresponding switch SW to be in on state for the high duration of the delayed pulse signal GSd.

The delay quantity Td is not limited to a value calculated in accordance with the above equation (5) when the power conversion system 100 converts the AC voltage Vac into the DC voltage Vdc. The delay quantity Td can be determined to any value as long as the delay quantity Td takes 1. A local minimum value for each of the positive half period P1 and the negative half period P2 of the AC voltage Vac 2. A local maximum value between the positive and negative half periods P1 and P2 of the AC voltage Vac The delay quantity Td is not limited to a value calculated in accordance with the above equation (8) when the power conversion system 100 converts the DC voltage Vdc into the AC voltage Vac. The delay quantity Td can be determined to any value as long as the delay quantity Td takes 1. A local maximum value for each of the positive half period P1 and the negative half period P2 of the AC voltage Vac 2. A local minimum value between the positive and negative half periods P1 and P2 of the AC voltage Vac The control apparatus according to each embodiment is configured to generate the reference waveform sin ωt assuming that the power factor between the AC voltage Vac and the alternating current Iac is set to 100%, but the present disclosure can be applied to a case where the power factor between the AC voltage Vac and the alternating current Iac is set to a predetermined percent other than 100%.

The control apparatus according to this modification can be configured to generate a reference waveform sin (ωt+α); the angle α is defined based on the power factor such that the reference waveform sin (ωt+α) has a deviation in phase relative to the AC voltage Vac. Then, the control apparatus according to this modification can be configured to calculate the pre-correction command current IL* in accordance with the reference waveform sin (ωt+α). That is, the control apparatus according to this modification can be configured to calculate the deviation range parameter Δi indicative of how the pre-correction command current IL* based on the reference waveform sin (ωt+α) is deviated from the average Iave of the inductor current ILr, and set the slope ms based on the deviation range parameter Δi.

Each control apparatus 30 is configured to add the slope compensation signal Slope to the inductor current ILr to thereby generate the slope-corrected inductor current, but can be configured to subtract the slope compensation signal Slope from the inductor current ILr to thereby generate a modified slope-corrected inductor current.

That is, the control apparatus 30 according to this modification can be configured to control the duty factor of the switch SW to thereby cause the inductor current ILr to follow the modified slope-corrected inductor current. The control apparatus 30 according to this modification can be configured to calculate the delay unit Td in accordance with the equation (5) or equation (8) in which the slope ms has been replaced with an absolute value |ms| of the slope.

The power conversion system 100 can be configured to perform both first power conversion from AC power into DC power, and second power conversion of DC power into AC power.

The control apparatuses and described in the present disclosure can be implemented by a dedicated computer including a memory and a processor programmed to perform one or more functions embodied by one or more computer programs.

The control apparatuses and methods described in the present disclosure can also be implemented by a dedicated computer including a processor comprised of one or more dedicated hardware logic circuits.

The control apparatuses and methods described in the present disclosure can further be implemented by a processor system comprised of a memory, a processor programmed to perform one or more functions embodied by one or more computer programs, and one or more hardware logic circuits.

The one or more programs can be stored in a non-transitory storage medium as instructions to be carried out by a computer or a processor.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those having ordinary skill in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A control apparatus applicable to a power converter that includes an inductor and a drive switch, and that converts one of an alternating-current voltage and a direct-current voltage input thereto into the other of the alternating-current voltage and the direct-current voltage, the control apparatus comprising:
a current obtainer configured to obtain a current flowing through the inductor as an inductor current;
an alternating-current voltage obtainer configured to obtain the alternating-current voltage;
a drive signal outputting unit configured to:
generate, based on the alternating-current voltage obtained by the voltage obtainer, a sinusoidal command; and
perform peak-current mode control to output a drive signal that controls switching of the drive switch to thereby cause the inductor current to follow the sinusoidal command; and
a delay unit configured to delay, for one switching cycle of the drive switch, an off-switching timing of the drive switch in accordance with the alternating-current voltage, the drive signal defining the off-switching timing of the switch.

2. The control apparatus according to claim 1, wherein:
the power converter is configured to convert the alternating-current voltage into the direct-current voltage; and
the delay unit is configured to set a delay quantity of the off-switching timing of the drive switch such that the delay quantity takes:
a local minimum value for each of a positive half period and a negative half period of the alternating-current voltage; and
a local maximum value between the positive and negative half periods of the alternating-current voltage.

3. The control apparatus according to claim 1, wherein:
the power converter is configured to convert the direct-current voltage into the alternating-current voltage; and
the delay unit is configured to set a delay quantity of the off-switching timing of the drive switch such that the delay quantity takes:
a local maximum value for each of a positive half period and a negative half period of the alternating-current voltage; and
a local minimum value between the positive and negative half periods of the alternating-current voltage.

4. The control apparatus according to claim 1, wherein:
the delay unit is configured to set the delay quantity in accordance with the alternating-current voltage and the direct-current voltage.

5. The control apparatus according to claim 2, wherein:
the delay unit is configured to calculate the delay quantity in accordance with the following equation (A):

$$Td = \frac{ms \cdot \left(1 - \frac{|Vac|}{Vdc}\right) + \frac{|Vac|}{2L} \cdot \left(1 - \frac{|Vac|}{Vdc}\right) \cdot Tsw}{\frac{|Vac|}{L} + ms} \quad (A)$$

where:
Td represents the delay quantity;
|Vac| represents an absolute value of the alternating-current voltage;
Vdc represents the direct-current voltage;
Tsw represents the one switching cycle of the drive switch; and
L represents an inductance of the inductor.

6. The control apparatus according to claim 3, wherein:
the delay unit is configured to calculate the delay quantity in accordance with the following equation (B):

$$Td = \frac{ms \cdot \frac{|Vac|}{Vdc} \cdot Tsw + \frac{Vdc - |Vac|}{2L} \cdot \frac{|Vac|}{Vdc} \cdot Tsw}{\frac{Vdc - |Vac|}{L} + ms} \quad (B)$$

where:
Td represents the delay quantity;
|Vac| represents an absolute value of the alternating-current voltage;
Vdc represents the direct-current voltage;
Tsw represents the one switching cycle of the drive switch; and
L represents an inductance of the inductor.

* * * * *